(12) United States Patent
Konwar et al.

(10) Patent No.: US 10,735,515 B2
(45) Date of Patent: Aug. 4, 2020

(54) LAYERED DISTRIBUTED STORAGE SYSTEM AND TECHNIQUES FOR EDGE COMPUTING SYSTEMS

(71) Applicant: Massachusetts Institute of Technology, Cambridge, MA (US)

(72) Inventors: Kishori Mohan Konwar, Revere, MA (US); Prakash Narayana Moorthy, Hillsboro, OR (US); Muriel Medard, Belmont, MA (US); Nancy Ann Lynch, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 208 days.

(21) Appl. No.: 15/986,202

(22) Filed: May 22, 2018

(65) Prior Publication Data
US 2018/0337996 A1 Nov. 22, 2018

Related U.S. Application Data

(60) Provisional application No. 62/509,390, filed on May 22, 2017.

(51) Int. Cl.
*G06F 15/16* (2006.01)
*H04L 29/08* (2006.01)
(Continued)

(52) U.S. Cl.
CPC ...... *H04L 67/1097* (2013.01); *G06F 11/1076* (2013.01); *H03M 13/154* (2013.01);
(Continued)

(58) Field of Classification Search
CPC ........... G06F 11/1076; H03M 13/1515; H03M 13/154; H03M 13/3761; H04L 41/06; H04L 67/1097
See application file for complete search history.

(56) References Cited

U.S. PATENT DOCUMENTS

2012/0096546 A1 4/2012 Dilley et al.
2012/0266044 A1\* 10/2012 Hu ...................... G06F 11/1092
714/763
(Continued)

OTHER PUBLICATIONS

Aguilera, et al.; "Dynamic Atomic Storage Without Consensus:" Journal of the ACM; 42(1); 29 pages; Jun. 2, 2009.
(Continued)

*Primary Examiner* — Normin Abedin
(74) *Attorney, Agent, or Firm* — Daly, Crowley, Mofford & Durkee, LLP

(57) ABSTRACT

A two-layer erasure-coded fault-tolerant distributed storage system offering atomic access for read and write operations is described. In some embodiments, a class of erasure codes known as regenerating codes (e.g. minimum bandwidth regenerating codes) for storage of data in a backend layer is used to reduce a cost of backend bulk storage and helps in reducing communication cost of read operations, when a value needs to be recreated from persistent storage in the backend layer. By separating the functionality of edge layer servers and backend servers, a modular implementation for atomicity using storage-efficient erasure-codes is provided. Such a two-layer modular architecture permits protocols needed for consistency implementation to be substantially limited to the interaction between clients and an edge layer, while protocols needed to implement erasure code are substantially limited to interaction between edge and backend layers.

20 Claims, 23 Drawing Sheets

(51) Int. Cl.
H03M 13/15 (2006.01)
G06F 11/10 (2006.01)
H04L 12/24 (2006.01)
H03M 13/37 (2006.01)
(52) U.S. Cl.
CPC ........ *H03M 13/3761* (2013.01); *H04L 41/06* (2013.01); *H03M 13/1515* (2013.01)

(56) References Cited

U.S. PATENT DOCUMENTS

| | | |
|---|---|---|
| 2013/0332814 A1 | 12/2013 | Marlow |
| 2014/0304513 A1 | 10/2014 | Novak et al. |
| 2014/0317206 A1* | 10/2014 | Lomelino ........... H04L 67/1097 709/206 |
| 2016/0012465 A1* | 1/2016 | Sharp ..................... G06Q 20/18 705/14.17 |

OTHER PUBLICATIONS

Aguilera, et al.: "Using Erasure Codes Efficiently for Storage in a Distributed System:" Proceedings of International Conference on Dependable Systems and Networks (DSN); 10 pages; Jun. 2005.

Attiya, et al.; "Sharing Memory Robustly in Message-Passing Systems:" Journal of the ACM; 42(1); 124-142; 24 pages; Feb. 16, 1990.

Bharambe, et al.; "Colyseus: A Distributed Architecture for Online Multiplayer Games;" 3$^{rd}$ Symposium on Networked Systems Design & Implementation; vol. 3; 14 pages; May 8-10, 2006.

Bonomi, et al.; "Fog Computing and Its Role in the Internet of Things;" MCC Workshop Mobile Cloud Computing; 3 pages; Aug. 17, 2012.

Cachin, et al.; "Optimal Resilience for Erasure-Coded Byzantine Distributed Storage;" Proceedings of International Conference on Dependable-Systems and Networks (DSN); 18 pages; Feb. 6, 2005.

Cadambe, et al.; "A Coded Sharing Atomic Memory Algorithm for Message Passing Architectures;" Proceedings of 13$^{th}$ IEEE International Symposium on Network Computing and Applications; vol. 30; Issue 1; 25 pages; Feb. 2017.

Cadambe, et al.; "Information-Theoretic Lower Bounds on the Storage Cost of Shared Memory Emulation;" Proceedings of the 2016 CAN Symposium on Principles of Distributed Computing; pp. 305-313; 10 pages; Jul. 25-28, 2016.

Dimakis, et al.; "A Survey on Network Codes for Distributed Storage;" Computer Science: Information Theory; 13 pages; Apr. 26, 2010.

Dimakis, et al; "Network Coding for Distributed Storage Systems;" IEEE Transactions on Information Theory; 56(9): 4539-4551;13 pages; Sep. 2010.

Dobre, et al.; "PoWerStore: Proofs of Writing for Efficient and Robust Storage;" Proceedings of the 2013 ACM SIGSAC Conference on Computer & Communications Security; 13 pages Nov. 4-8, 2013.

Dutta, et al.; "Optimistic Erasure-Coded Distributed Storage:" Proceedings of the 22$^{nd}$ International Symposium on Distributed Computing (DISC); 20 pages; Sep. 22-24, 2008.

Evans; "The Internet of Things: How the Next Evolution of the Internet is Changing Everything;" CISCO Internet Business Solutions Group (IBSG); 11 pages, Apr. 2011.

Fan, et al.: "Efficient Replication of Large Data Objects;" Distributed Algorithms, Lecture Notes in Computer Science; vol. 2848; pp. 75-91; 17 pages; Jan. 2003.

Guerraoui, et al.; "The Collective Memory of Amnesic Process;" ACM Transactions on Algorithms; vol. 4; No, 1; Article 12; 31 pages; Mar. 2008.

Hendricks, et al.; "Low-Overhead Byzantine Fault-Tolerant Storage;" SOSP'07; ACM SIGOPS Operating Systems Review; vol. 41; pp. 73-76; 14 pages; Oct. 14-17, 2007.

Ho, et al; "A Random Linear Network Coding Approach to Multicast;" IEEE Transactions on Information Theory; 52(10): 32 pages; Oct. 2006.

Konwar, et al.; "RADON: Repairable Atomic Data Object in Networks;" 30$^{th}$ IEEE International Parallel & Distributed Processing Symposium (IPDPS); 25 pages; Nov. 21, 2016.

Konwar, et al.; "Storage-Optimized Data-Atomic Algorithms for Handling Erasures and Errors in Distributed Storage Systems;" 2016 IEEE International Parallel and Distributed Processing Symposium (IPDPS); 10 pages; May 23-27, 2016.

Krishnan, et al.; "Evaluation of Codes with inherent Double Replication for Hadoop;" Hot Storage '14; 6$^{th}$ USENIX Workshop on Hot Topics in Storage and File Systems; 5 pages; Jun. 17-18, 2014.

Lakshman, et al.; "Cassandra—A Decentralized Structured Storage System;" SIGOPS Operating Systems; Rev. 44(2):35-40; 6 pages; Apr. 2010.

Lynch, et al.; "RAMBO: A Reconfigurable Atomic Memory Service for Dynamic Networks;" Proceedings of 16$^{th}$ International Symposium on Distributed Computing (DISC); LNCS; vol. 2508; pp. 173-190; 18 pages; Jan. 2002.

Nygren, et al.; "The Akamai Network: A Platform for High-Performance Internet Applications;" ACM SIGOPS Operating Systems Review; vol. 44; Issue 3; pp. 2-19; 18 pages; Jul. 2010.

Rashmi, et al.; "Having Your Cake and Eating it Too: Jointly Optimal Erasure Codes for I/O, Storage; and Network-Bandwidth;" Open Access to the Proceedings of the 13$^{th}$ USENIX Conference on File and Storage Technologies (FAST); 15 pages; Feb. 16-19, 2015.

Rashmi, et al.; "Optimal Exact-Regenerating Codes for Distributed Storage at the MSR and MBR Points via a Product-Matrix Construction;" IEEE Transactions on Information Theory; vol. 57; Issue 8; 20 pages; Jan. 20, 2011.

Reed, et al.; "Polynomial Codes Over Certain Finite Fields;" Journal of the Society for Industrial and Applied Mathematics; vol. 8; 2 pages; Jun. 1960.

Sathiamoorthy, et al.; "XORing Elephants: Novel Erasure Codes for Big Data;" Proceedings of the 39$^{th}$ International Conference on Very Large Data Bases; vol. 6; No. 5; pp. 325-336; 12 pages; Aug. 26-30, 2013.

Shi, et al.; "Edge Computing: Vision and Challenges;" IEEE Internet of Things Journal; vol. 3; No. 5; 10 pages; Oct. 2016.

Spiegelman, et al.; "Space Bounds for Reliable Storage: Fundamental Limits of Coding;" Proceedings of the International Conference on Principles of Distributed Systems; 3 pages; Jul. 2015.

PCT International Preliminary Report on Patentability dated Nov. 26, 2019 for International Application No. PCT/US2018/033844; 7 Pages.

Gao, et al.; "Application Specific Data Replication for Edge Services"; WWW 2003; May 20-24, 2003; 12 Pages.

PCT Notification of Transmittal of the International Search Report and Written Opinion of the ISR dated Aug. 3, 2018 for PCT/US2018/033844; 1 Page.

PCT Search Report dated Aug. 3, 2018 for PCT/US2018/033844; 2 Pages.

PCT Written Opinion of the ISR dated Aug. 3, 2018 for PCT/US2018/033844; 9 Pages.

* cited by examiner

LAYERED DISTRIBUTED STORAGE SYSTEM AND TECHNIQUES FOR EDGE COMPUTING SYSTEMS

CROSS REFERENCE TO RELATED APPLICATIONS

This application claims the benefit of U.S. Provisional Application No. 62/509,390 filed May 22, 2017, titled "LAYERED DISTRIBUTED STORAGE SYSTEM AND TECHNIQUES FOR EDGE COMPUTING SYSTEM," which application is incorporated by reference herein in its entirety.

GOVERNMENT RIGHTS

This invention was made with Government support under Grant Nos. FA9550-13-1-0042 and FA9550-14-1-0403 awarded by the Air Force Office of Scientific Research and under Grant Nos. CCF-1217506 and CCF-093970 awarded by the National Science Foundation. The Government has certain rights in the invention.

BACKGROUND

As is known in the art, edge computing systems and applications which utilize such systems are an emerging distributed computing paradigm. In edge-computing, users (or "clients") interact with servers on an edge of a network. Such servers are thus said to form a first layer of servers. The edge servers, in turn, interact with a second layer of servers in a backend of the edge computing system and thus are (referred to as "backend layer servers". While the edge servers are typically in geographic proximity to clients, the backend layer of servers are often provided as part of a data-center or a cloud center which is typically geographically distant from the clients and edge servers. The geographic proximity of the edge servers to clients permits high speed operations between clients and the edge layer, whereas communication between the edge servers and the backend is typically much slower. Such decentralized edge processing or computing is considered to be a key enabler for Internet of Things (IoT) technology.

As is also known, providing consistent access to stored data is a fundamental problem in distributed computing systems, in general, and in edge computing systems, in particular. Irrespective of the actual computation involved, application programs (also referred to simply as "applications" or more simply "apps") in edge computing systems must typically write and read data. In settings where several writers attempt to concurrently or simultaneously update stored data, there is potential confusion on the version of data that should be stored during write operations and returned during read operations. Thus, implementation of strong consistency mechanisms for data access is an important problem in edge computing systems and is particularly important in those systems which handle massive amounts of data from many users.

To reduce, and ideally minimize, potential confusion with respect to different versions of the same data, consistency policies (or rules) may be imposed and implemented to deal with problems which arise because of concurrent access of data by clients. One well-known and widely acknowledged, and the most desirable form of consistency policy is known as "atomicity" or "strong consistency" which, at an application level, gives users of a distributed system (e.g. an edge computing system) the impression of a single machine executing concurrent read and write operations as if the executions take place one after another (i.e. sequentially). Thus, atomicity, which in simple terms, gives the users of a data service the impression that the various concurrent read and write operations take place sequentially. An ideal consistency solution should complete client operations via interaction only with the edge layer, whenever possible, thereby incurring low latency.

This is not possible, however, in all situations since practical edge servers have finite resources such as finite storage capacity and in some systems and/or uses the edge layer servers may be severely restricted in their total storage capacity as well as in other resources. For example, in situations where several thousands of files are being serviced, the edge servers typically do not have the capacity to store all the files all the time. In such situations, the edge servers rely upon the backend layer of servers for permanent storage of files that are less frequently accessed. Thus, the servers in the first layer act as virtual clients of the second layer servers.

Although various consistency policies (often weaker than strong consistency) are widely implemented and used in conventional processing systems, there is a lack of efficient implementations suitable for edge-computing systems. One important challenge in edge-computing systems, as described above, is reducing the cost of operation of the backend layer servers. Communication between the edge layer servers and backend layer servers, and persistent storage in the backends layer contribute to the cost of operation of the backend layer. Thus, cost reduction may be accomplished by making efficient use of the edge layer servers.

SUMMARY

Described herein are concepts, systems and techniques directed toward a layered distributed storage (LDS) system and related techniques. In one embodiment, a two-layer erasure-coded fault-tolerant distributed storage system offering atomic access for read and write operations is described. Such systems and techniques find use in distributed storage systems including in edge computing systems having distributed storage.

The systems and techniques described herein addresses the edge computing challenges of: (1) reducing the cost of operation of backend layer servers by making efficient use of edge layer servers by: (a) controlling communication between edge layer servers and backend layer servers; and (b) controlling persistent storage in the backend layer; (2) enforcing/controlling consistency (e.g. atomic access for read and write operations); and (3) completing client operations via interaction only with the edge layer servers, whenever possible.

The described systems and techniques enable atomicity consistent data storage in edge computing systems for read and write operations while maintaining a desirable level of speed for users. In embodiments, the advantages of the concepts, come from the usage of erasure codes. In embodiments, minimum band width regenerating (MBR) codes may be used. In embodiments, random linear network codes (RLNC) may be used.

Since the techniques and systems described herein can be specifically adapted for edge-computing systems, a number of features can be provided. For example, as may be required by some edge-computing systems, the LDS technique described herein ensure that clients interact only with the edge servers and not with backend servers. In some embodiments, this may be an important requirement for applying the LDS technique to edge-computing systems. By ensuring that clients interact only with the edge servers and not with backend servers, the LDS techniques described herein allow completion of client-operations by interacting only with the edge layer (i.e. only a client need only interact with one or more edge layer servers). Specifically, a client write-operation (i.e. a client writes data) stores an updated file into the edge-layer and terminates. The client write-operation need not wait for the edge-layer to offload the data to the backend layer. Such a characteristic may be particularly advantageous in embodiments which include high speed links (e.g. links which provide a relatively low amount of network latency) between clients and edge layer servers. For a read operation, the edge-layer may effectively act as proxy-cache that holds the data corresponding to frequently updated files. In such situations, data required for a read maybe directly available at edge layer, and need not be retrieved from the backend layer.

Also, the LDS system and techniques described herein efficiently use the edge-layer to improve (and ideally optimize) the cost of operation of the backend layer. Specifically, the LDS technique may use a special class of erasure codes known as minimum bandwidth regenerating (MBR) codes to simultaneously improve (and ideally optimize) communication cost between the two layers, as well as storage cost in the backend layer.

Further still, the LDS technique is fault-tolerant. In large distributed systems, the individual servers are usually commodity servers, which are prone to failures due to a variety of reasons, such as, power failures, software bugs, hardware malfunction etc. Systems operating in accordance with LDS techniques described herein, however, are able to continue to serve the clients with read and write operations despite the fact that some fraction of the servers may crash at unpredictable times during the system operation. Thus, the system is available as long as the number of crashes does not exceed a known threshold.

The underlying mechanism used to for fault-tolerance is a form of redundancy. Usually, simple redundancy such as replication increases storage cost, but at least some embodiments described herein use erasure codes to implement such redundancy. The LDS techniques described herein achieves fault-tolerance and low storage and/or communication costs all at the same time.

In accordance with one aspect of the concepts described herein, a layered distributed storage (LDS) system includes a plurality of edge layer servers coupled to a plurality of backend layer servers. Each of the edge layer servers including an interface with which to couple to one or more client nodes, a processor for processing read and/or write requests from the client nodes and for generating tag-value pairs, a storage for storing lists of tag-value pairs and a backend server layer interface for receiving tag-value pairs from said processor and for interfacing with one or more of the plurality of backend servers. Each of the backend layer servers includes an edge-layer interface for communicating with one or more servers in the edge layer, a processor for generating codes and a storage having stored therein, coded versions of tag-value pairs. In some cases, the tag-value pairs may be coded via erasure coding, MBR coding or random linear network coding techniques. The backend layer servers are responsive to communications from the edge layer servers.

In preferred embodiments, the storage in the edge-layer servers is temporary storage and the storage in the backend layer servers is persistent storage.

With this particular arrangement, a system and technique which enables atomic consistency in edge computing systems is provided. Since users (or clients) interact only with servers in the edge layer, the system and technique becomes practical for use in edge computing systems, where the client interaction needs to be limited to the edge. By separating the functionality of the edge layer servers and backend servers, a modular implementation for atomicity using storage-efficient erasure-codes is provided. Specifically, the protocols needed for consistency implementation are largely limited to the interaction between the clients and the edge layer, while those needed to implement the erasure code are largely limited to the interaction between the edge and backend layers. Such modularity results in a system having improved performance characteristics and which can be used in applications other than in edge-computing applications.

The LDS technique described herein thus provides a means to advantageously use regeneration codes (e.g. storage-efficient erasure codes) for consistent data storage.

It should be appreciated that in prior art systems, use of regenerating codes is largely limited to storing immutable data (i.e. data that is not updated). For immutable data, these codes provide good storage efficiency and also reduce network bandwidth for operating the system.

Using the techniques described herein, however, the advantages of good storage efficiency and reduced network bandwidth possible via regenerating codes can be achieved even for data undergoing updates and where strong consistency is a requirement. Thus, the LDS techniques described herein enable the use of erasure codes for storage of frequently-updated-data. Such systems for supporting frequently-updated-data are scalable for big-data applications. Accordingly, the use of erasure codes as described herein provides edge computing systems having desirable efficiency and fault-tolerance characteristics.

It is recognized that consistent data storage implementations involving high volume data is needed in applications such as networked online gaming, and even applications in virtual reality. Thus, such applications may now be implemented via the edge-computing system and techniques described herein.

In accordance with a further aspect of the concepts described herein, it has been recognized that in systems which handle millions of files, (which may be represented as objects), edge servers in an edge computing system do not have the capacity to store all the objects for the entire duration of execution. In practice, at any given time, only a fraction of all objects (and in some cases, a very small fraction of all objects) undergo concurrent accesses; in the system described herein, the limited storage space in the edge layer may act as a temporary storage for those objects that are getting accessed. The backend layer of servers provide permanent storage for all objects for the entire duration of execution. The servers in the edge layer may thus act as virtual clients of the second layer backend.

As noted above, an important requirement in edge-computing systems is to reduce the cost of operation of the backend layer. As also noted, this may be accomplished by making efficient use of the edge layer. Communication between the edge and backend layers, and persistent storage in the backend layer contribute to the cost of operation of the second layer. These factors are addressed via the techniques described herein since the layered approach to implementing an atomic storage service carries the advantage that, during intervals of high concurrency from write operations on any object, the edge layer can be used to retain the more recent versions that are being (concurrently) written, while filtering out the outdated versions. The ability to avoid writing every version of data to the backend layer decreases the overall write communication cost between the two layers. The architecture described thus permits the edge layer to be configured as a proxy cache layer for data that are frequently read, to thereby avoid the need to read from the backend layer for such data.

In embodiments, storage of data in the backend layer may be accomplished via the use of codes including, but not limited to erasure codes and random linear network codes. In some embodiments, a class of erasure codes known as minimum bandwidth regenerating codes may be used. From a storage cost view-point, these may be as efficient as popular erasure codes such as Reed-Solomon codes.

It has been recognized in accordance with the concept described herein that use of regenerating codes, rather than Reed-Solomon codes for example, provides the extra advantage of reducing read communication cost when desired data needs to be recreated from coded data stored in the backend layer (which may, for example, correspond to a cloud layer). It has also been recognized that minimum bandwidth regenerating (MBR) codes may be utilized for simultaneously optimizing read and storage costs.

Accordingly, the system and techniques described may herein utilize regenerating codes for consistent data storage. The layered architecture described herein naturally permits a layering of the protocols needed to implement atomicity and erasure codes (in a backend layer e.g. a cloud layer). The protocols needed to implement atomicity are largely limited to interactions between the clients and the edge servers, while those needed to implement the erasure code are largely limited to interactions between the edge and backend (or cloud) servers. Furthermore, the modularity of the implementation described herein makes it suitable even for situations that do not necessarily require a two-layer system.

The layered distributed storage (LDS) concepts and techniques described herein enable a multi-writer, multi-reader atomic storage service over a two-layer asynchronous network.

In accordance with one aspect of the techniques described herein, a write operation completes after writing an object value (i.e. data) to the first layer. It does not wait for the first layer to store the corresponding coded data in the second layer.

For a read operation, concurrency with write operations increases the chance of content being served directly from the first layer. If the content (or data) is not served directly from the first layer, servers in the first layer regenerate coded data from the second layer, which are then relayed to the reader.

In embodiments, servers in the first layer interact with those of the second layer via so-called write-to-backend layer ("write-to-L2") operations and regenerate-from-backend-layer and "regenerate-from-L2" operations for implementing the regenerating code in the second layer.

In a system having first and second layers, with the first layer having $n_1$ servers and the second layer having $n_2$ servers, the described system may tolerate a number of failures $f_1$, $f_2$ in the first and second layers, respectively corresponding to $f_1 < n_1/2$ and $f_2 < n_2/2$.

In a system with $n_1 = \theta(n_2)$; $f_1 = \theta(n_1)$; $f_2 = \theta(n_2)$, the write and read costs are respectively given by $\theta(n_1)$ and $\theta(1) + n_1 1$ ($\delta > 0$) where $\delta$ is a parameter closely related to the number of write or internal write-to-L2 operations that are concurrent with the read operation. Note that $1(\delta > 0)$ equates to 1 if $\delta > 0$ and 0 if $\delta = 0$. Note that the symbol $a = \theta(b)$ in the context any two variable parameters a and b is used to mean that the value of a is comparable to b and only differs by a fixed percent. The ability to reduce the read cost to $\theta(1)$, when $\delta = 0$ comes from the usage of minimum bandwidth regenerating (MBR) codes. In order to ascertain the contribution of temporary storage cost to the overall storage cost, a multi-object (say N) analysis may be performed, where each of the N objects is implemented by an independent instance of the LDS technique. The multi-object analysis assumes bounded latency for point-to-point channels. The conditions on the total number of concurrent write operations per unit time are identified, such that the permanent storage cost in the second layer dominates the temporary storage cost in the first layer, and is given by $\theta(N)$. Further, bounds on completion times of successful client operations, under bounded latency may be computed.

The use of regenerating codes enables efficient repair of failed nodes in distributed storage systems. For the same storage-overhead and resiliency, the communication cost for repair (also referred to as "repair-bandwidth"), is substantially less than what is needed by codes such as Reed-Solomon codes. In one aspect of the techniques described herein, internal read operations are cast by virtual clients in the first layer as repair operations, and this enables a reduction in the overall read cost. In one aspect of the techniques described herein, MBR codes, which offer exact repair, are used. A different class of codes knomin as Random Linear Network Codes (RLNC) may also be used. RLNC codes permit implementation of regenerating codes via functional repair. RLNC codes offer probabilistic guarantees, and permit near optimal operation of regenerating codes for choices of operating point.

A edge layer server comprising:
an interface with which to couple to one or more client nodes,
a processor for processing read and/or write requests from the client nodes and for generating tag-value pairs; and
a storage configured to store lists of tag-value pairs.

A backend layer server comprising:
an edge-backend layer interface configured to couple said server to one or more edge layer servers;
a processor for generating codes; and
a storage configured to store coded versions of tag-value pairs stored therein.

In a system having a layered architecture for coded consistent distributed storage, a method of reading data comprising:
a server $s_j$ in the edge layer $\mathcal{L}_1$ reconstructs coded data $c_j$ using content from a backend layer $\mathcal{L}_2$. wherein coded data $c_j$ may be considered as part of the code C, and the coded data $c_j$ is reconstructed via a repair procedure invoked by a server $s_j$ in the edge layer $\mathcal{L}_1$ where d helper servers belong to the backend layer $\mathcal{L}_2$.

BRIEF DESCRIPTION OF THE DRAWINGS

The foregoing features may be more fully understood from the following description of the drawings in which.

DETAILED DESCRIPTION

Figure 1:
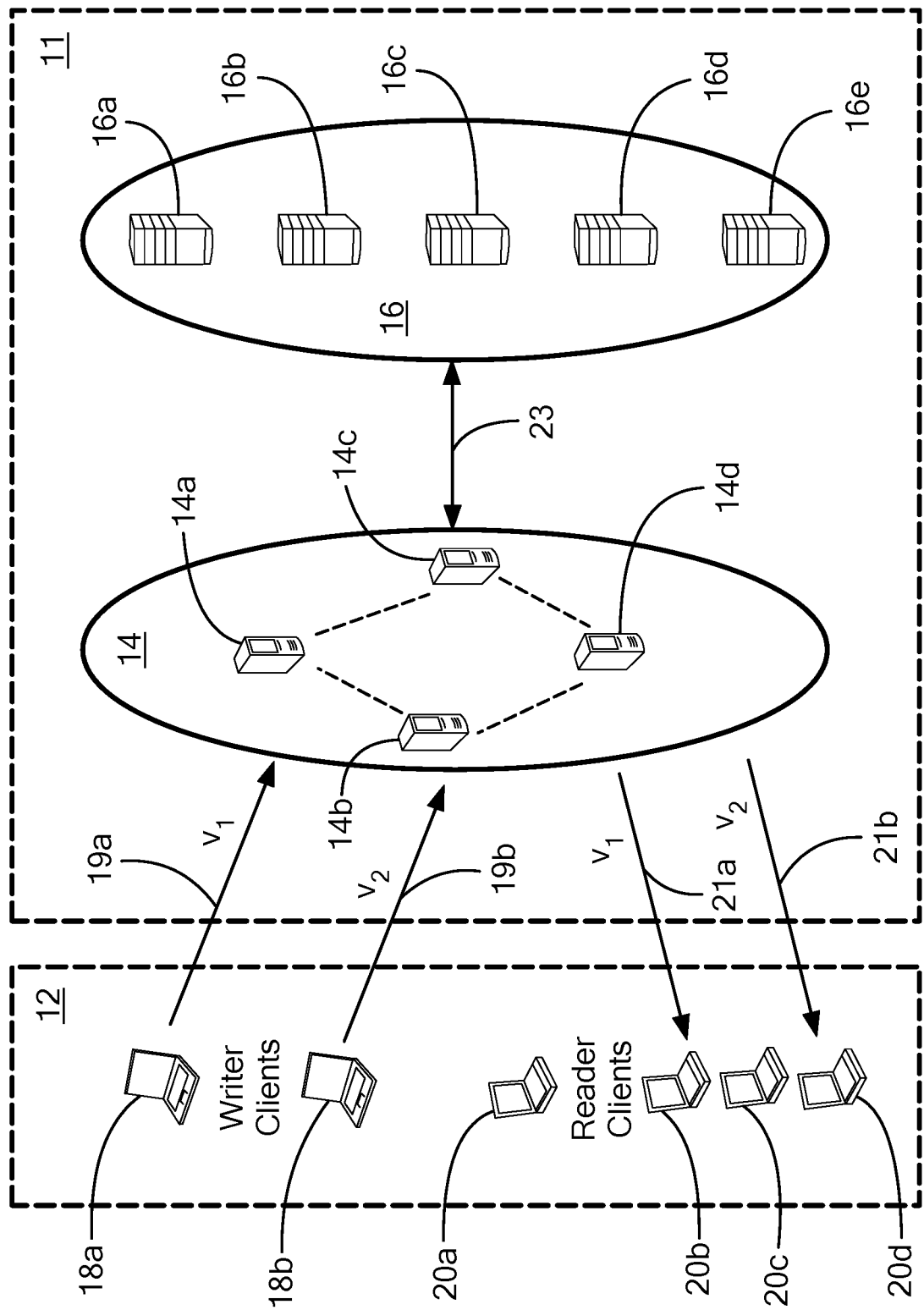
FIG. 1 is a schematic diagram of a system having a layered architecture for coded consistent distributed storage coupled to a plurality of client nodes.

Referring now to FIG. 1 a network having a layered architecture for coded consistent distributed storage includes a two-layer erasure-coded fault-tolerant distributed storage system 11 comprising a plurality of edge layer servers 14a-14d generally denoted 14 and a plurality of backend layer servers 16a-16e generally denoted 16.

It should be appreciated that although only four edge layer servers 14a-14d are illustrated in this particular example, the system 11 may include any number of edge layer servers 14. Similarly, although only five backend layer servers 16a-16e are illustrated in this particular example, the system 11 may include any number of backend layer servers 16. In general edge layer $\mathcal{L}_1$ may include $n_1$ servers while backend layer $\mathcal{L}_2$ may include $n_2$ servers.

A plurality of client nodes 12 (also sometimes referred to herein as "clients" or "users") are coupled to the edge layer servers 14. For clarity, writer clients (i.e., client nodes which want to write content (or data) v1, v2 to consistent storage in the backend layer 16) are identified with reference numbers 18a, 18b and reader clients (i.e., client nodes which want to read content or data) are identified with reference numerals 20a-20d.

When system 11 is provided as part of an edge computing system, high speed communication paths (i.e. communication paths which provide low network latency between clients 12 and servers 14) may exist between clients 12 and servers 14 in the edge layer $\mathcal{L}_1$.

Further, backend layer servers 16 may be provided as part of a data center or a cloud center and are typically coupled to the edge layer servers 14 via one or more communication paths 23 which are typically slower than high speed paths 19, 21 (in terms of network latency).

As illustrated in FIG. 1, writer clients 18a, 18b may each independently provide two versions (v1, v2) of the same content to the edge layer servers 14. In a manner to be described below in detail, edge layer servers 14 resolve which is the most recent version of the data and may provide the most recent version (in this case, version v2 of the content) to the backend layer servers 16 via communication path 23 for persistent storage.

Similarly, one or more of reader clients 20a-20d may each independently request the latest versions of desired content from the edge layer servers 14. In a manner to be described below in detail, edge layer servers 14 provide the most recent version of the content (in this case version v2 of the content) to appropriate ones of the reader clients 20a-20d. Such content is sometimes provided directly from one or more of the edge layer servers 14 and sometimes edge layer servers 14 communicate with backend layer servers 16 to retrieve and deliver information needed to provide the requested content to one or more of the reader clients 20a-20d.

Figure 1A:
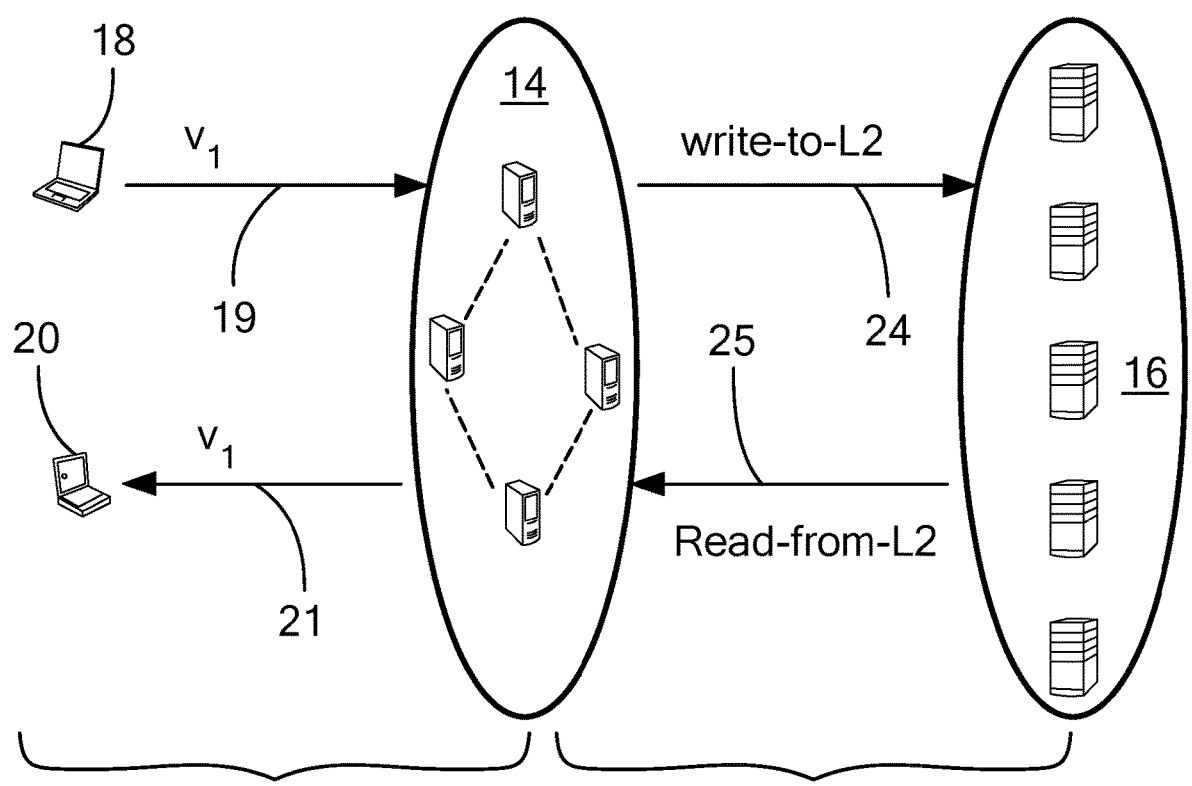
FIG. 1A is a schematic diagram illustrating read and write operations in a network having a layered architecture for coded consistent distributed storage.

Referring now to FIG. 1A, it is significant that client-edge interactions (i.e., interactions between client nodes such as writer and reader nodes 18, 20 and edge layer servers 14a-14c) implement consistency in the system 11 while the edge-backend interaction (i.e., interactions between edge layer servers 14 and backend layer servers 16) implement (largely) erasure or other codes (e.g. RLNC). That is, the protocols needed for consistency implementation are largely limited to the interaction between the clients 12 and the edge layer servers 14, while the protocols needed to implement the erasure or other codes are largely limited to the interaction between the edge layer servers 14 and the backend layer servers 18.

Figure 2:
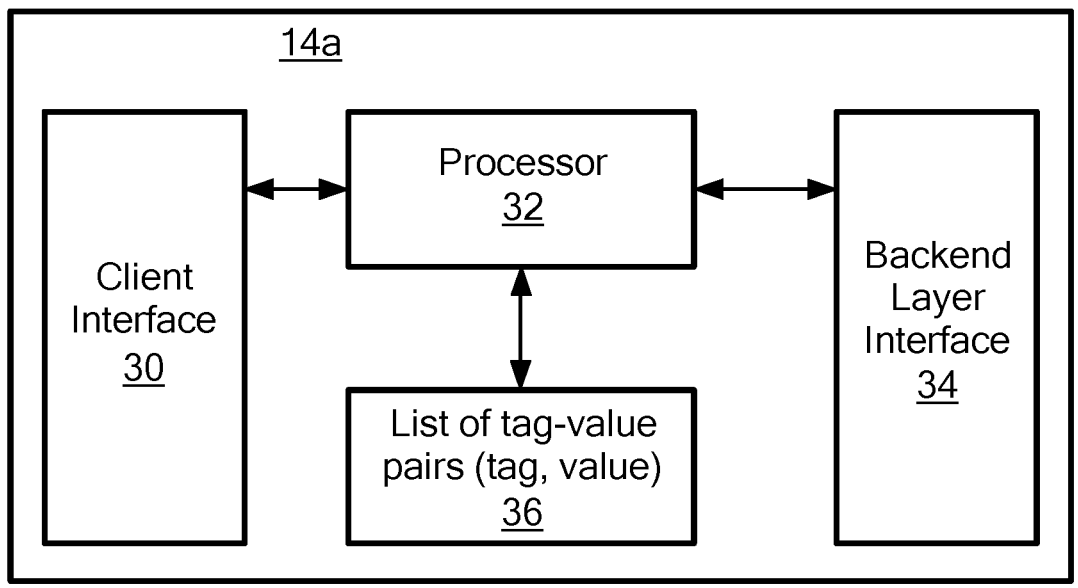
FIG. 2 is a block diagram of an edge layer server.

Referring now to FIG. 2, a typical edge layer server 14a includes a client node interface 30 coupled to a processor 32. Processor 32 is coupled to a backend layer interface 34. Thus, edge node layer server can communicate with both client nodes 12 (FIG. 1) and backend layer nodes 16 (FIG. 1). Significantly, client nodes 12 do not communicate directly with the backend layer servers 16. Each of the edge layer servers 14 also include storage 36 (which may, in preferred embodiments, be provided as temporary storage) in which lists of tag-value pairs (t,v) are stored.

Figure 2A:
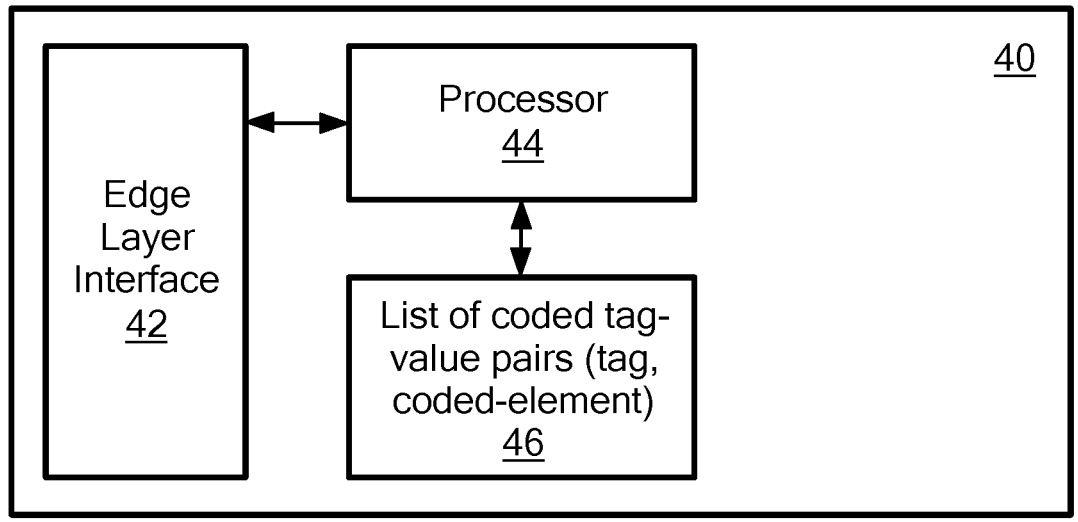
FIG. 2A is a block diagram of a backend layer server.

Referring now to FIG. 2A, a typical backend layer server 40 which may be the same as or similar to backend layer servers 16 described above in conjunction with FIG. 1, includes an edge-layer interface 42 coupled to a processor 44. Processor 44 is also coupled to a storage 46 (which may, in preferred embodiments, be provided as a temporary storage). Storage 46 is configured to have stored therein one or more lists of tag-value pairs (t,v) which may be stored using regenerating codes or RLNC's, for example. As will become apparent from the description herein, processor 44 aids in a regeneration process.

Before describing write and read operations which may take place in layered distributed storage (LDS) system (in conjunction with FIGS. 3-4J below), an overview as well as some introductory concepts and definitions are provided. It should be appreciated that in the illustrative system and techniques described herein, it is assumed that a distributed storage system comprises asynchronous processes of three types: writers (W), readers (R) and servers (S). The servers are organized into two logical layers $\mathcal{L}_1$ and $\mathcal{L}_2$, with $\mathcal{L}_1$ consisting of $n_i$, i=1; 2 servers.

Each process has a unique id, and the ids are totally ordered. Client (reader/writer) interactions are limited to servers in $\mathcal{L}_1$, and the servers in $\mathcal{L}_1$ in turn interact with servers in $\mathcal{L}_2$. Further, the servers in $\mathcal{L}_1$ and $\mathcal{L}_2$ are denoted by $\{s_1, s_2, \ldots, s_{n1}\}$ and $\{s_{n1+1}, s_{n1+2}, \ldots, s_{n1+n2}\}$, respectively.

It is also assumed that the clients are well-formed, i.e., a client issues a new operation only after completion of its previous operation, if any. As will be described in detail below, the layer 1-layer 2 $\mathcal{L}_1$-$\mathcal{L}_2$ interaction happens via the well defined actions write-to-L2 and regenerate-from-L2. These actions are sometimes referred to herein as internal operations initiated by the servers in $\mathcal{L}_1$.

Also, a crash failure model is assumed for processes. Thus, once a process crashes, it does not execute any further steps for the rest of the execution.

The LDS technique described herein is designed to tolerate $f_i$ crash failures in layer $\mathcal{L}_i$; i=1; 2, where $f_1 < n_1/2$ and $f_2 < n_2/3$. Any number of readers and writers can crash during the execution. The above bounds arise from making sure sufficient servers in each of the layers of servers are active to guarantee a sufficient number of coded elements for a tag in order to allow decoding of the corresponding value. Communication may be modeled via reliable point-to-point links between any two processes. This means that as long as the destination process is non-faulty, any message sent on the link is guaranteed to eventually reach the destination process. The model allows the sender process to fail after placing the message in the channel; message-delivery depends only on whether the destination is non-faulty.

With respect to liveness and atomicity characteristics, one object, say x, is implemented via the LDS algorithm supporting read/write operations. For multiple objects, multiple instances of the LDS algorithm are executed. The object value v comes from the set V. Initially v is set to a distinguished value $v_0$ ($\in$V). Reader R requests a read operation on object x. Similarly, a write operation is requested by a writer W. Each operation at a non-faulty client begins with an invocation step and terminates with a response step. An operation Tr is incomplete in an execution when the invocation step of π does not have the associated response step; otherwise the operation π is complete. In an execution, an operation (read or write) $\pi_1$ precedes another operation $\pi_2$, if the response step for operation $\pi_1$ precedes the invocation step of operation $\pi_2$. Two operations are concurrent if neither precedes the other.

"Liveness," refers to the characteristic that during any well-formed execution of the LDS technique, any read or write operation initiated by a non-faulty reader or writer completes, despite the crash failure of any other clients and up to $f_1$ server crashes in the edge layer $\mathcal{L}_1$, and up to $f_2$ server crashes in the backend layer $\mathcal{L}_2$. Atomicity of an execution refers to the characteristic that the read and write operations in the execution can be arranged in a sequential order that is consistent with the order of invocations and responses.

With respect to the use of regenerating codes, a regenerating-code framework is used in which, a file $\mathcal{F}$ of size B symbols is encoded and stored across n nodes such that each node stores a symbols. The symbols are assumed to be drawn from a finite field $\mathbb{F}_q$, for some q. The content from any k nodes (ka symbols) can be used to decode the original file $\mathcal{F}$ For repair of a failed node, the replacement node contacts any subset of d≥k surviving nodes in the system, and downloads β symbols from each of the d symbols. The β symbols from a helper node is possibly a function of the α symbols in the node. The parameters of the code, say C, will be denoted as $\{(n, k, d)(\alpha; \beta)\}$ having a file-size B upper bounded by B≥.

Two extreme points of operation correspond to the minimum storage overhead (MSR) operating point, with B=kα and minimum repair bandwidth (MBR) operating point, with α=dβ. In embodiments, codes at the MBR operating point may be used. The file-size at the MBR point may be given by $B_{MBR} = \sum_{i=0}^{k-1}(d-i)\beta$.

In some embodiments, it may be preferable to use exact-repair codes, meaning that the content of a replacement node after repair is substantially identical to what was stored in the node before crash failure. A file $\mathcal{F}$ corresponds to the object value v that is written. In other embodiments, it may be preferable to use codes which are not exact repair codes such as random linear network codes (RLNCs).

In embodiments (and as will be illustrated in conjunction with FIGS. 3-3E below), an $\{(n=n_1+n_2, k, d)(\alpha, \beta)\}$ MBR code designated as C may be used. The parameters k and d are such that where $n_1=2f_1+k$ and $n_2=2f_2+d$, two additional codes $C_1$ and $C_2$ derived from the code C may be defined. The code $C_1$ is obtained by restricting attention to the first $n_1$ coded symbols of C, while the code $C_2$ is obtained by restricting attention to the last $n_2$ coded symbols of C. Thus if $[c_1 c_2 \ldots c_{n1} c_{n1+1} \ldots c_{n1+n2}]$; $c_1 \in$ denotes a codeword of C, the vectors $[c_1 c_2 \ldots c_{n1}]$ and $[c_{n1+1} \ldots c_{n1+n2}]$ will be codewords of $C_1$ and $C_2$, respectively.

The usage of these three codes is as follows. Each server in the first edge layer $\mathcal{L}_1$, having access to the object value v (at an appropriate point in the execution) encodes the object value v using code $C_2$ and sends coded data $c_{n1+i}$ to server $s_{n1+1}$ in $\mathcal{L}_2$; $1 \geq i \geq_{n2}$. During a read operation, a server $s_j$ in the edge layer $\mathcal{L}_1$ can potentially reconstruct the coded data $c_j$ using content from the backend layer $\mathcal{L}_2$. Here, coded data $c_j$ may be considered as part of the code C, and the coded portion $c_j$ gets reconstructed via a repair procedure (invoked by server $s_j$ in the edge layer $\mathcal{L}_1$) where the d helper servers belong to the backend layer $\mathcal{L}_2$. By operating at the MBR point, it is possible to reduce and ideally minimize the cost needed by the server $s_j$ to reconstruct cj. Finally, in the LDS technique described herein, the possibility that the reader receives k coded data elements from k servers in the edge layer $\mathcal{L}_1$, during a read operation is permitted. In this case, the reader uses the code $C_1$ to attempt decoding an object value v.

An important property of one MBR code construction, which is needed in one embodiment of the LDS technique described herein, is the fact that a helper node only needs to know the index of the failed node, while computing the helper data, and does not need to know the set of other d−1 helpers whose helper data will be used in repair. It should be noted that not all regenerating code constructions, including those of MBR codes, have this property. In embodiments, a server $s_j \in \mathcal{L}_1$ requests for help from all servers in the backend layer $\mathcal{L}_2$, and does not know a priori, the subset of d servers $\mathcal{L}_2$ that will form the helper nodes. In this case, it is preferred that each of the helper nodes be able to compute its β symbols without the knowledge of the other d−1 helper servers.

In embodiments, internal read operations may be cast by virtual clients in the first layer as repair operations, and this enables a reduction in the overall read cost.

With respect to storage and communication costs, the communication cost associated with a read or write operation is the (worst-case) size of the total data that gets transmitted in the messages sent as part of the operation. While calculating write-cost, costs due to internal write-to-L2 operations initiated as a result of the write may be included, even though these internal write-to-L2 operations do not influence the termination point of the write operation. The storage cost at any point in the execution is the worst-case total amount of data that is stored in the servers in the edge layer $\mathcal{L}_1$ and the backend layer $\mathcal{L}_2$. The total data in the edge layer $\mathcal{L}_1$ contributes to temporary storage cost, while that in the backend layer $\mathcal{L}_2$ contributes to permanent storage cost. Costs contributed by meta-data (data for book keeping such as tags, counters, etc.) may be ignored while ascertaining either storage or communication costs. Further the costs may be normalized by the size of the object value v; in other words, costs are expressed as though size of the object value v is 1 unit.

A write operation will be described below in conjunction with FIGS. 3-3H.

Figure 3:
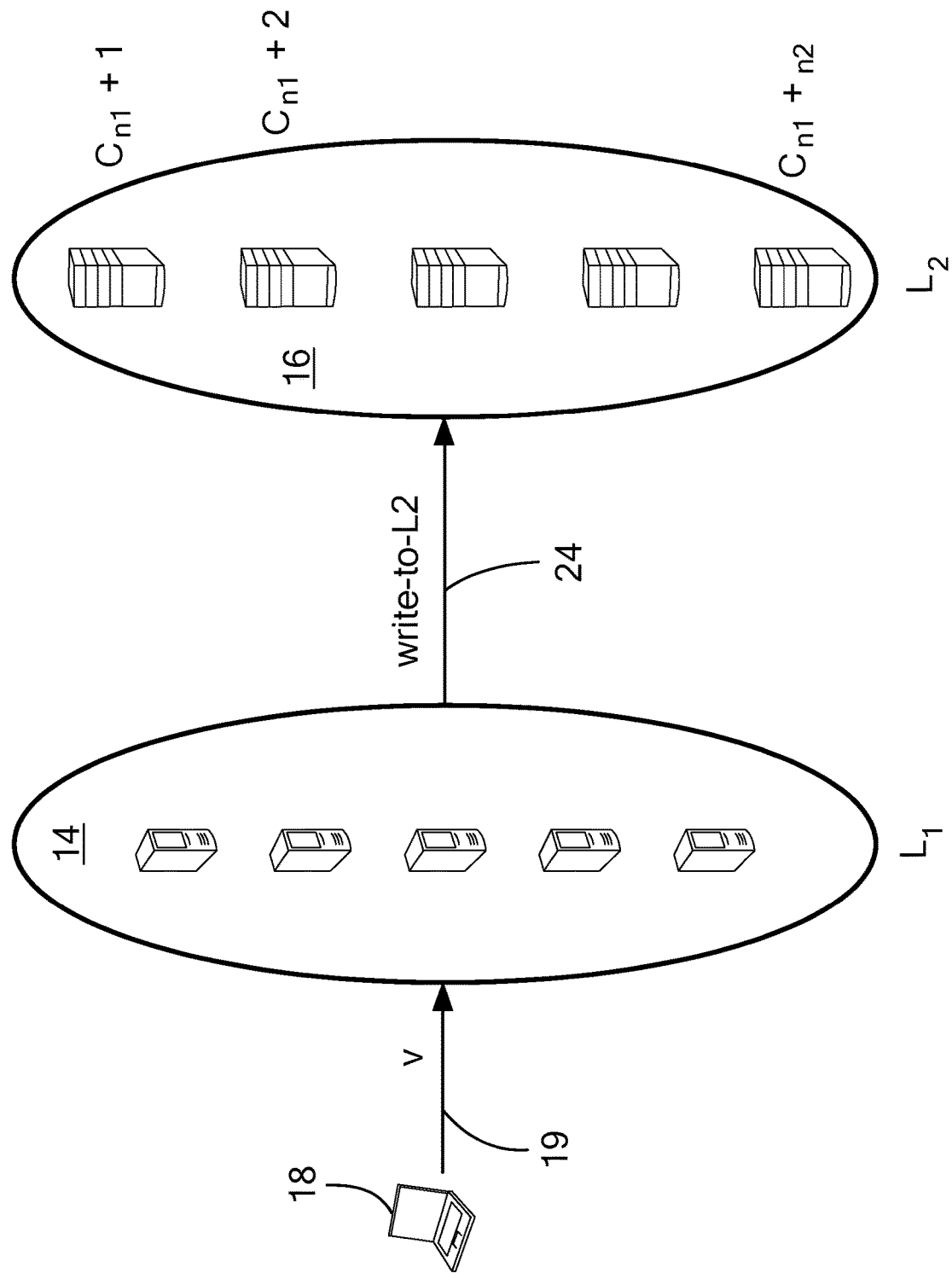
FIG. 3 is a schematic diagram of a writer client writing content to a backend layer server through an edge layer server.

Referring now to FIG. 3, writer 18 seeks to write content (also referred to as an "object value" V) to servers 14 in an edge layer $\mathcal{L}_1$, via a communication path 19. Upon receiving the value V (and after doing certain operations—to be described in the other figures), edge layer servers 14 perform an internal "write-to-L2" operation in which the value is written to persistent storage (e.g. storage 46 in FIG. 2A) in backend servers 16 in the backend layer $\mathcal{L}_2$. The write-to-L2 operation is executed over communication path 24 and is described below in conjunction with FIG. 3C.

Figure 3A:
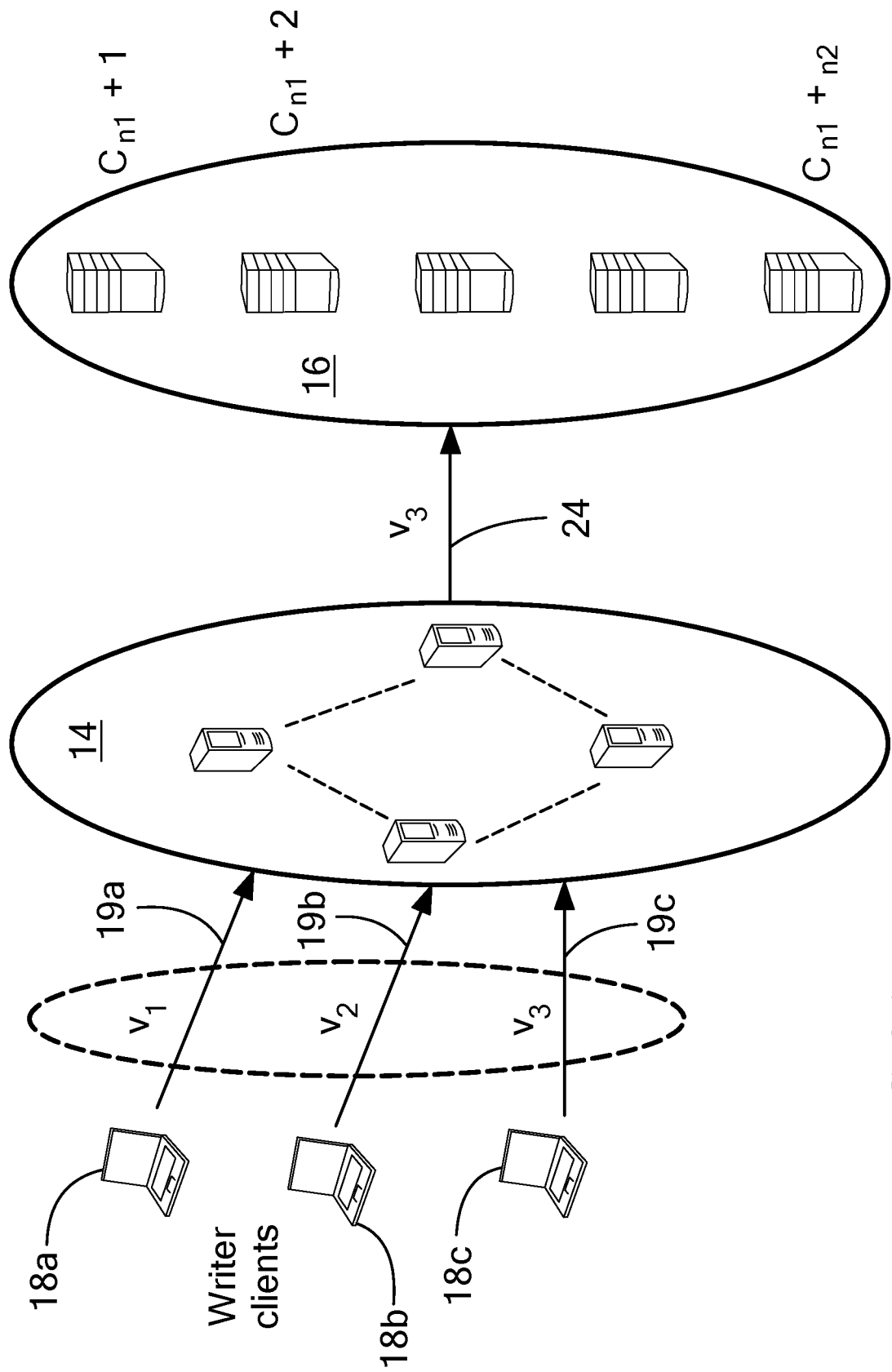
FIG. 3A is a schematic diagram illustrating concurrent write operations from a plurality of different writer nodes to an edge layer.

Referring now to FIG. 3A, a plurality of writers, here three writers 18a, 18b, 18c, concurrently write three versions $v_1$, $v_2$, $v_3$ of the same content to servers 14 via communication paths 19a-19c. In a manner to be described in detail below, servers 14 determine which version of the content (in this example version $v_3$) to send to persistent storage in backend servers 16 via communication path 24. As illustrated in FIG. 3A, the content is coded with codes $c_{n1}+1-c_{n1}+n_2$ and distributed among ones of backend servers 16. In this example, the content is distributed among all servers 16.

In embodiments, the ideal goal is to store the respective coded content in all the back end servers. With this goal in mind, the respective coded elements are sent to all backend servers. It is satisfactory if $n_2-f_2$ responses are received back (i.e., the internal write operation is considered complete if we know for sure that the respective coded elements are written to at least $n_2-f_2$ backend layer servers).

Figure 3B:
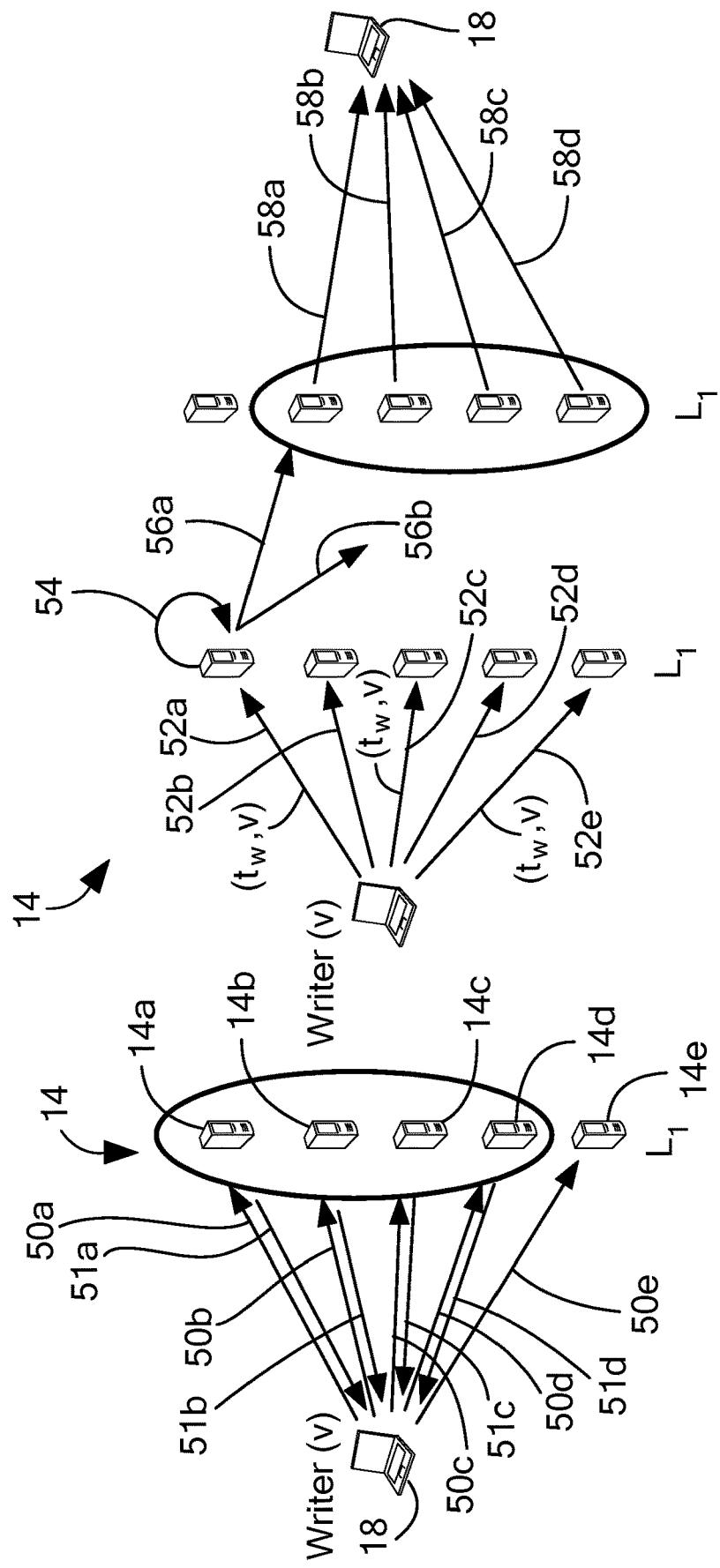
FIG. 3B is a schematic diagram illustrating two phases of a write operation.

Referring now to FIG. 3B, an edge layer 14 of an edge computing system includes five edge layer servers 14a-14e (i.e. n.=5) and a write-client 18 (or more simply "writer" 18) which initiates a write of content v. In general, the write operation has two phases, and aims to temporarily store the object value v in the edge layer $\mathcal{L}_1$ such that up to $f_1$ failures of servers in the edge layer $\mathcal{L}_1$ does not result in loss of the value. In the illustrative example, the value of $f_1$ is set to one (i.e. $f_1=1$) and the value of k is set to three (i.e. k=3). The values of $f_1$ and $f_2$ are selected based upon the values of $n_1$ and $n_2$ respectively, and k and d are dependent on the parameters of the selected codes as described above.

During the first phase (also sometimes referred to as the "get tag" phase), the writer 18 determines a new tag for the value to be written. A tag comprises a pair of values: a natural number, and an identifier, which can be simply a string of digits or numbers, for example (3, "id"). One tag is considered to be larger or more recent than another if either the natural number part of the first tag is larger than the other, or if they are equal, the identifier of the first tag is lexicographically larger (or later) than that of the second tag. Therefore, for any two distinct tags there is a larger one, and in the same vein, in a given set of tags there is a tag that is the largest of all. Note that such a tag is used in lieu of an actual timestamp.

In the second phase (also referred to as the "put data" phase), the writer sends the new tag-value pair to all severs in the edge layer $\mathcal{L}_1$, which add the incoming pair to their respective local lists (e.g. one or more lists in temporary storage 36 as shown in FIG. 2). Any server that adds a new tag-value pair to its list also broadcasts a corresponding data-reception message (e.g. a meta-data) 56a-56b to other servers in the edge layer $\mathcal{L}_1$. Servers 15 each send an acknowledgment 58a-58d back to the writer 18 only after they hears broadcast messages from at least $f_1+k$ of the servers 14, including itself. It should be appreciated that in this example edge layer server 14e does not sent an acknowledgment message—i.e. there is one failure ($f_1=1$). Subsequently, each server that receives the $f_1+k$ messages for this tag initiates the write-to-L2 action with an aim to offload the tag-value pair to permanent storage in backend layer $\mathcal{L}_2$.

It is important to note that the writer is not kept waiting for completion of the internal write-to-L2 operation. That is, no communication with the backend layer $\mathcal{L}_2$ is needed to complete a write operation. Rather, the writer terminates as soon as it receives a threshold number of acknowledgments (e.g. $f_1+k$ acknowledgments) from the servers in the edge layer $\mathcal{L}_1$. Once a server (e.g. server 14a) completes the internal write-to-L2 operation, the value associated with the write operation is removed from the temporary storage of the server 14a (e.g. removed from storage 36 in FIG. 2). The server may also take this opportunity to clear any old entry from its list which may help to eliminate entries corresponding to any failed writes from the list.

In the techniques described herein, a broadcast primitive 56 is used for certain meta-data message delivery. The primitive has the property that if the message is consumed by any one server in the edge layer $\mathcal{L}_1$, the same message is eventually consumed by every non-faulty server in the edge layer $\mathcal{L}_1$. One implementation of the primitive, on top of reliable communication channels is described in co-pending application Ser. No. 15/838,966 filed on Dec. 12, 217 and incorporated herein by reference in its entirety. In this implementation, the process that invokes the broadcast protocol first sends, via point-to-point channels, the message to a fixed set $S_{f_1+1}$ of $f_1+1$ servers in the edge layer $\mathcal{L}_1$. Each of these servers, upon reception of the message for first time, sends the message to all the servers in the edge layer $\mathcal{L}_1$, before consuming the message itself. The primitive helps in the scenario when the process that invokes the broadcast protocol crashes before sending the message to all edge layer servers.

Figure 3C:
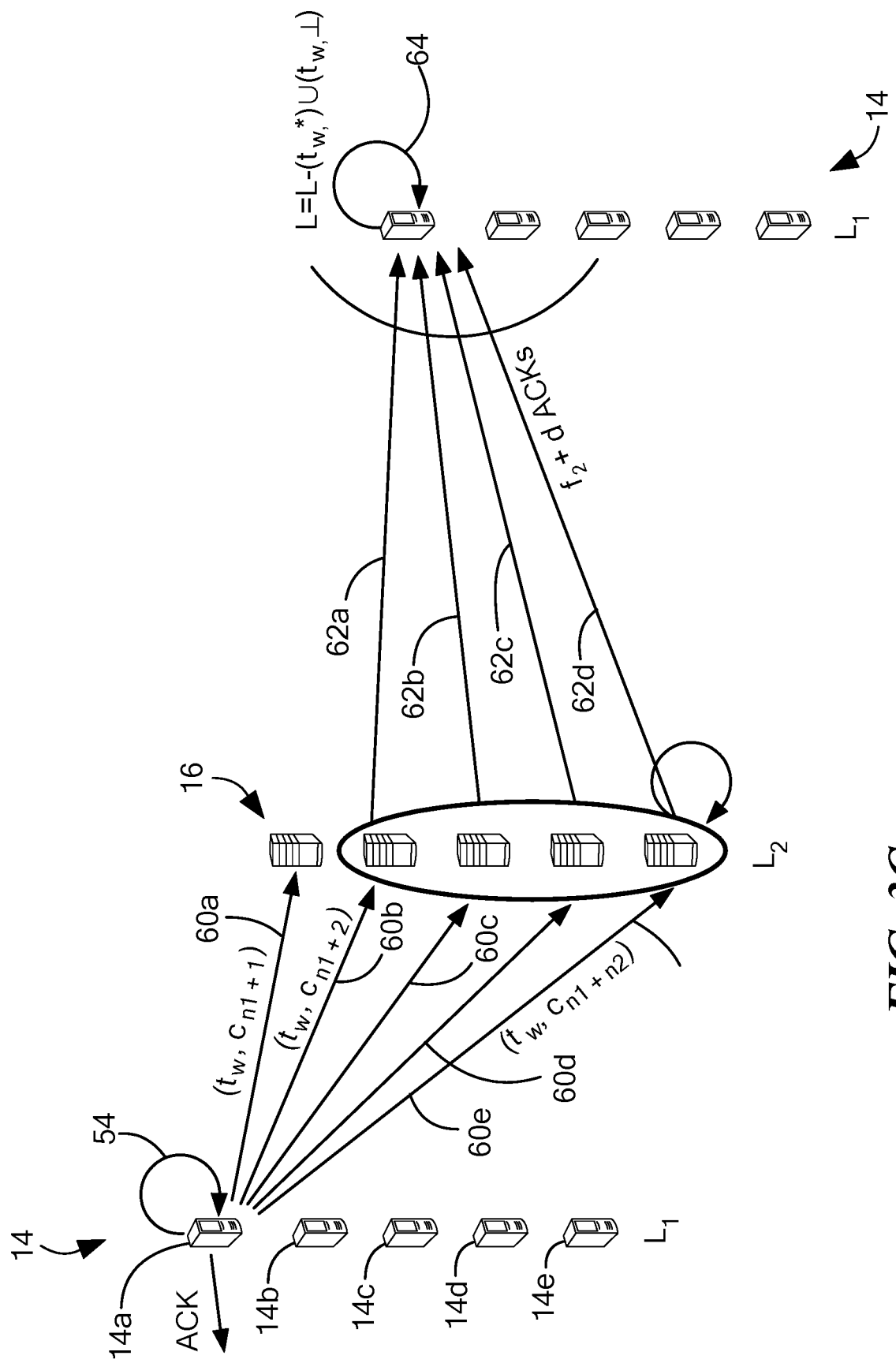
FIG. 3C is a schematic diagram illustrating an internal write-to-a backend layer server operation (aka "internal write-to-L2" operation)

Referring now to FIG. 3C, an internal write-to-L2 operation is shown. Each server in the edge layer $\mathcal{L}_1$ uses a committed tag $t_c$ to keep track of the latest tag-value pair that it writes to the backend layer $\mathcal{L}_2$. A server initiates the internal write-to-L2 operation for a new tag-value pair (t,v) only if the new tag t is more recent than the committed tag $t_c$ (i.e. $t>t_c$), else the new tag-value pair (t,v) is simply ignored.

In the technique described herein, each server in the backend layer $\mathcal{L}_2$ stores coded data corresponding to exactly one tag at any point during the execution. A server in the backend layer $\mathcal{L}_2$ that receives tag-coded-element pair (t,c) as part of an internal write-to-L2 operation replaces the local a tag-coded-element pair $(t_l, c_l)$ with the incoming pair one if the new tag value t is more recent than the local tag value $t_l$ (i.e. $t>t_l$). The write-to-L2 operation initiated by a server s in the edge layer $\mathcal{L}_1$ terminates after it receives acknowledgments from $f_1+d$ servers in the backend layer $\mathcal{L}_2$. It should be appreciated that in this approach no value is stored forever in any non-faulty sere in the edge layer $\mathcal{L}_1$. The equations for selection of k, d are provided above.

Figure 3D:
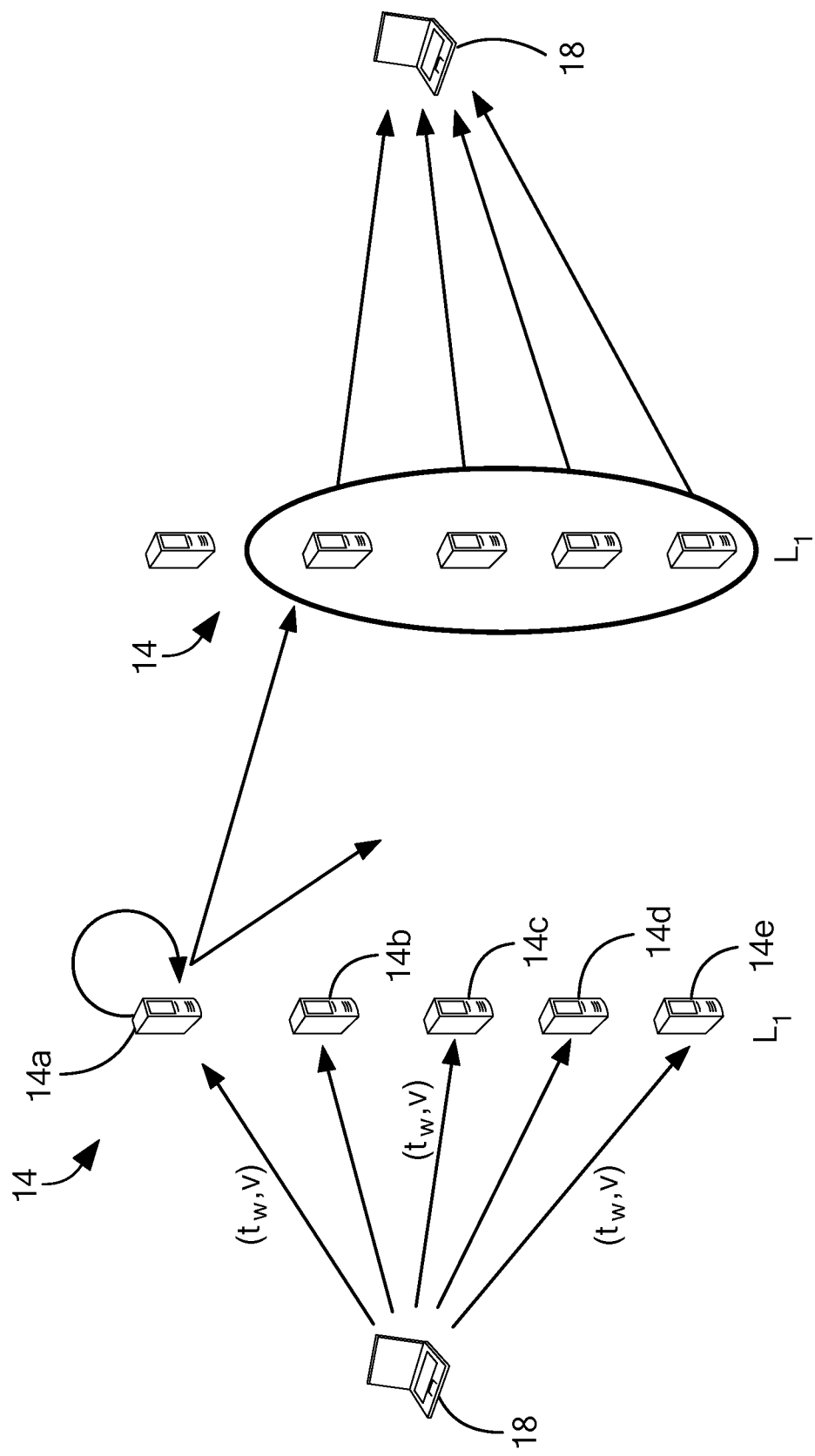
FIG. 3D is a schematic diagram illustrating the role of a broadcast primitive.

Referring now to FIG. 3D, the role of a broadcast primitive is described. It should be appreciated that the role of a broadcast primitive is such that either all (non-faulty) servers 14 in the edge layer $\mathcal{L}_1$ receive a message or no servers 14 in the edge layer $\mathcal{L}_1$ receive a message. In one embodiment, the broadcast primitive uses an $O(n^2)$ communication cost protocol. In some portions of the process described herein the following mechanism is required for the process to work as desired. Suppose a client wants to send a message to all n servers then the desired result is that either (a) all of the non-faulty servers receive the messages eventually or (b) none of the servers receive it, which is applicable when the client fails while sending these messages. In other words, it is not desirable to have a scenario in which some of the non-faulty servers receives the message and some other set of non-faulty servers does not receive it. Such as guarantee is achieved by using a broadcast primitive, i.e., a protocol that can achieve this guarantee.

As illustrated in FIG. 3D, a writer transmits a tag-value pair (tw,v) to each edge layer server 14. Upon reception of the tag-value pair (tw,v) each server broadcasts a message in the edge layer indicating that it has received the tag-value pair (tw,v). For example, server 14a broadcasts to servers 14b-14e. Once each server receives a sufficient number of broadcast messages (e.g. $f_1+k$ broadcast messages) the server sends an acknowledgment to the writer 18.

The broadcast primitive serves at least two important purposes. First, it permits servers 14 in edge layer $\mathcal{L}_1$ to delay an internal write-to-L2 operation until sending an acknowledgment ack to the writer; and second, the broadcast primitive avoids the need for a "writing back" of values in a read operation since the system instead writes back only tags. This is important to reduce costs to O(1) while reading from servers in the backend layer $\mathcal{L}_2$ (since MBR codes are not enough). O(1) refers to a quantity that is independent of the system size parameters such as $n_1$ or $n_2$.

Figure 3E:
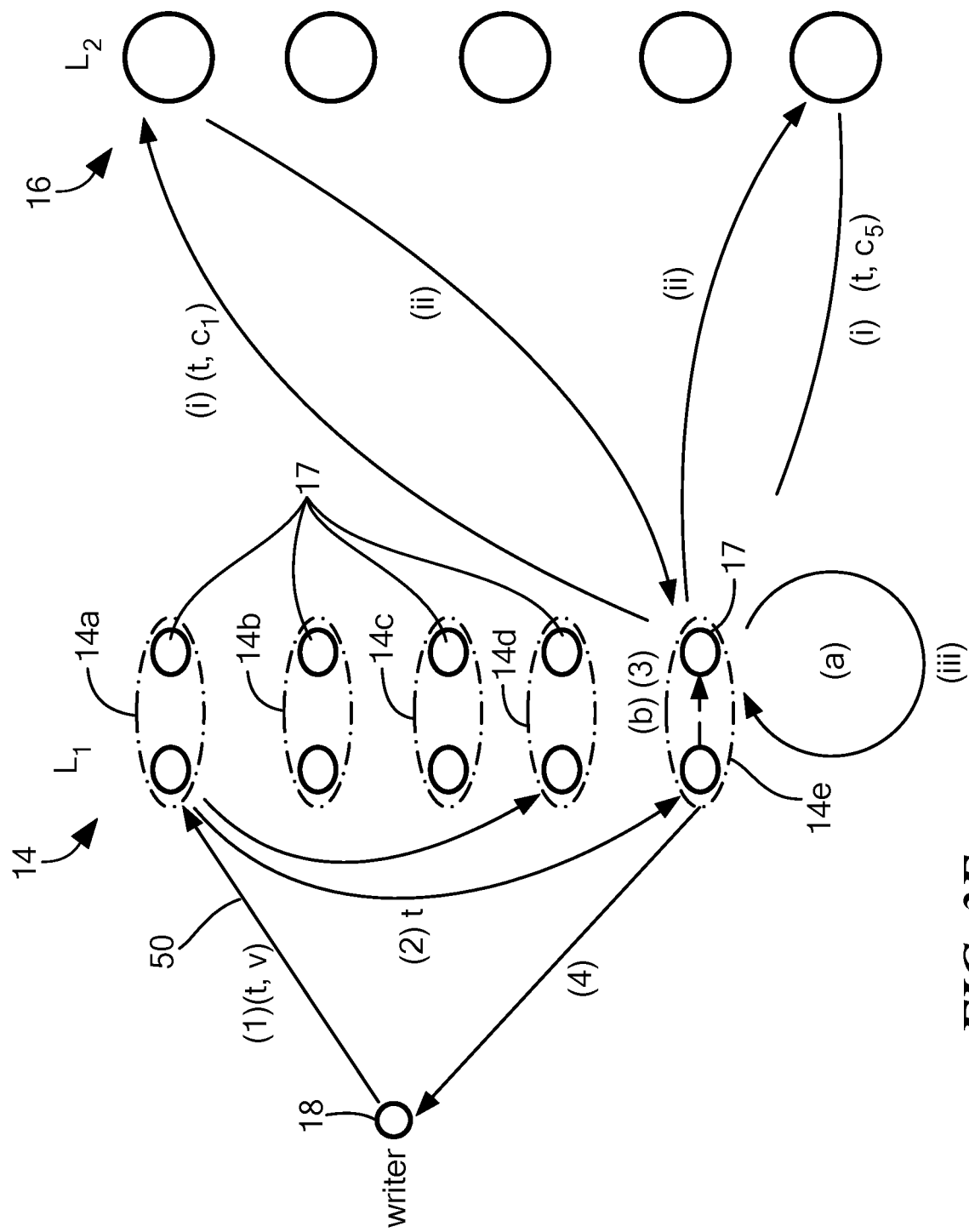
FIG. 3E is a schematic diagram illustrating write operations between a writer client, edge layer servers and backend layer servers.

Referring now to FIG. 3E, all processes for a write operation are shown. A writer 18 determines a new tag (t) for a value (v) to be written and transmits 50 the new tag-value pair (t,v) to a server 14a. The server 14a broadcasts reception of the new tag-value pair to edge layer servers 14b-14e. Once each server receives a desired/sufficient number of broadcast messages (e.g. $f_1+k$ broadcast messages), the server commits the new tag value pair to storage 17 and then initiates an internal write-to-L2 operation as described above in conjunction with FIG. 3C.

In one embodiment the LDS technique for a writer w∈W and reader r∈R includes a writer, executing a "get-tag" operation which includes sending a QUERY-TAG to servers in the edge layer $\mathcal{L}_1$. The writer then waits for responses from $f_1+k$ servers, and selects the most recent (or highest) tag t. The writer also performs a "put-data" operation which includes creating a new tag $t_w=(t:z+1;w)$ and sending (PUT-DATA, $(t_w; v)$) to servers in $\mathcal{L}_1$. The client then waits for responses from $f_1+k$ servers in $\mathcal{L}_1$, and terminates.

It should be appreciated that in one embodiment, tags are used for version control of the object values. A tag t is defined as a pair (z,w), where z∈ℕ and w∈W ID of a writer; or a null tag which we denote by ⊥. We use $\mathcal{T}$ to denote the set of all possible tags. For any two tags $t_1$; $t_2 \in T$ we say $t_2 > t_1$ if (i) $t_{2,z} > t_{1,z}$ or (ii) $t_{2,z} = t_{1,z}$ and $t_{2,w} > t_{1,w}$ or (ii) $t_1 = \bot$ and $t_2 \ne \bot$.

Each server s in the edge layer $\mathcal{L}_1$ maintains the following state variables: a) a list L⊆T×V, which forms a temporary storage for tag-value pairs received as part of write operations, b) Γ⊆$\mathcal{R}$×T, which indicates the set of readers being currently served. The pair (r; treq)∈Γ indicates that the reader r requested for tag treq during the read operation. c) $t_c$: committed tag at the server, d) K: a key-value set used by the server as part of internal regenerate-from-L2 operations. The keys belong to $\mathcal{R}$, and values belong to T×$\mathcal{H}$. Here $\mathcal{H}$ denotes the set of all possible helper data corresponding to coded data elements $\{c_s(v), v \in V\}$. Entries of $\mathcal{H}$ belong to. In addition to these, the server also maintains a three counter variable for various operations. The state variable for a server in the backend layer $\mathcal{L}_2$ comprises one (tag, coded-element) pair. For any server s, the notation s.y is used to refer to its state variable y. Thus, the notation s.y$|_T$ represents the value of s.y at point T of the execution. It should be appreciated that an execution fragment of the technique is simply an alternating sequence of (the collection of all) states and actions. An "action," refers to a block of code executed by any one process without waiting for further external inputs.

Figure 3F:
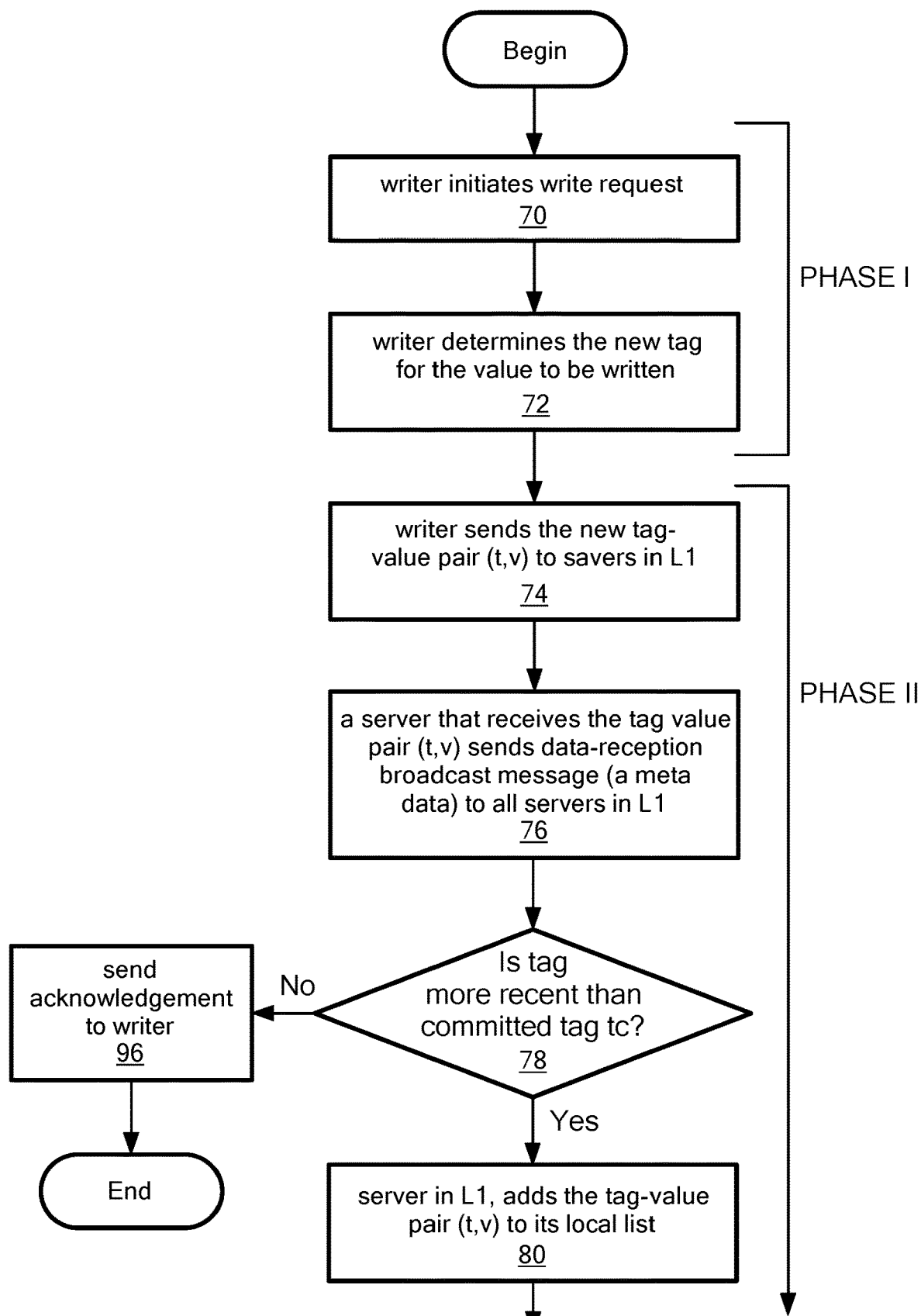
FIGS. 3F-3H are a series of flow diagrams illustrating a write operation.
Figure 3G:
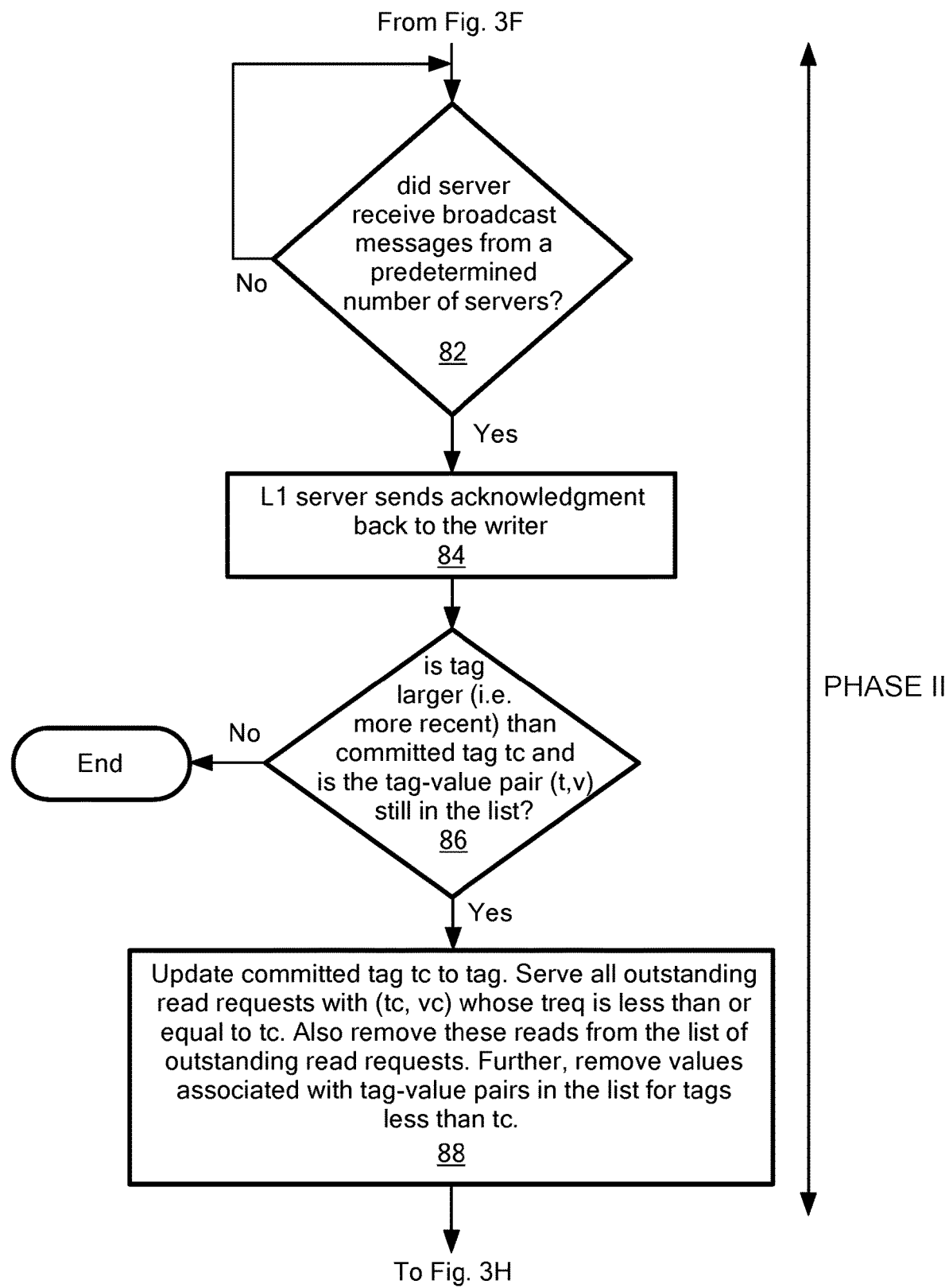
Figure 3H:
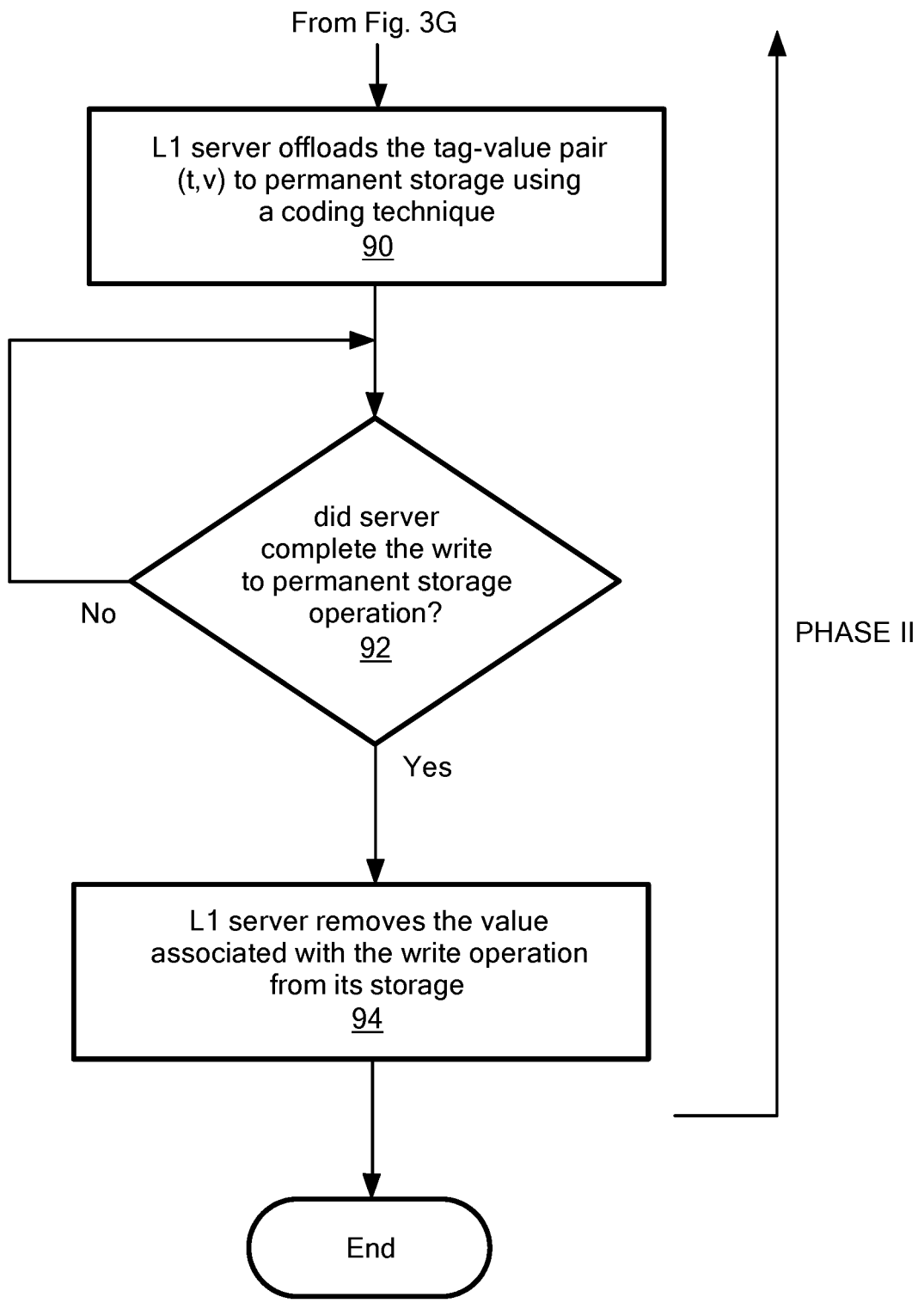

FIGS. 3F-3H are a series of flow diagrams which illustrate processing that can be implemented within an edge computing system and clients coupled thereto (e.g., within client, edge layer servers and backend layer servers shown in FIG. 1). Rectangular elements (typified by element 70 in FIG. 3F), herein denoted "processing blocks," represent computer software instructions or groups of instructions. Diamond shaped elements (typified by element 78 in FIG. 3F), herein denoted "decision blocks," represent computer software instructions, or groups of instructions, which affect the execution of the computer software instructions represented by the processing blocks.

Alternatively, the processing and decision blocks may represent steps performed by functionally equivalent circuits such as a digital signal processor (DSP) circuit or an application specific integrated circuit (ASIC). The flow diagrams do not depict the syntax of any particular programming language but rather illustrate the functional information of one of ordinary skill in the art requires to fabricate circuits or to generate computer software to perform the processing required of the particular apparatus. It should be noted that many routine program elements, such as initialization of loops and variables and the use of temporary variables may be omitted for clarity. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order.

Referring now to FIGS. 3F-3H in an embodiment, processing begins in processing block 70 where a writer node (e.g. one of nodes 18 in FIG. 1) initiates a write request. This may be accomplished, for example, by sending a query-tag to all servers in the edge layer $\mathcal{L}1$. And of course, only the servers in $\mathcal{L}1$ which will not crash (i.e., non-faulty) will eventually receive the message. Processing then proceeds to block 72 where the writer determines a new tag (t) (e.g. a time stamp) for a value (v) (i.e. content or data) to be written. Processing blocks 70 and 72 comprise phase I of a write operation.

Phase II of the write operation begins in processing block 74 in which the writer sends the new tag-value pair (t,v) to servers in the edge-layer $\mathcal{L}_1$. Preferably the tag-value pair is sent to all servers in the edge layer $\mathcal{L}_1$. Processing then proceeds to processing block 76 in which each server in the edge-layer that receives the tag-value pair (t,v) sends a data reception broadcast message (e.g. a metadata) to all servers in the edge layer $\mathcal{L}_1$.

Processing then proceeds to decision block 78 in which it is determined, whether the tag-value pair corresponds to a new tag-value pair for that server (i.e. is the newly received tag-value pair more recent that already committed tag-value pair tc in that server). If a decision is made that the tag pair is not a new tag pair then an acknowledgment is sent to the writer as shown in processing block 96.

If in decision block 78 a decision is made that the tag pair does correspond to a new tag pair, then processing proceeds to block 80 in which the servers in the edge-layer add the incoming tag-value pair (t,v) to their respective local lists (e.g. as stored in each layer server storage 36 in FIG. 2). Processing then proceeds to decision block 82 in which a decision is made as to whether the server received a broadcast message from a predetermined number of other edge layer servers (e.g. at least $f_1+k$ edge layer servers, including itself. The number of broadcast messages which must be received is selected such that it is "safe" for the writer to terminate the write operation before waiting for the edge layer to off-load the coded data to the back-end layer. By "safe," it is meant that it is guaranteed that the at least one edge-server will successfully complete write-to-L2 operation. It should be noted that in practice this is implemented as an interrupt driven procedure rather than as a decision loop. The loop implemented by decision block 82 is shown only as a matter of convenience in order to promote clarity in the description of the drawings and the explanation of the broad concepts sought to be protected herein.

In response to an edge layer server receiving broadcast messages from a predetermined number of servers, processing proceeds to processing block 84 in which each of the edge layer server sends an acknowledgment back to the writer. The writer needs $f_1+k$ ACKS, so at least $f_1+k$ servers must send an acknowledgment (ACK).

Processing then proceeds to decision block 86 in which a decision is made as to whether the tag is more recent than an already existing tag in the server (i.e. a committed tag $t_c$) and whether the tag-value pair (t,v) is still in the tag-value pair list for that edge layer server.

If the tag is not more recent or if the tag is not still in the list, then processing ends.

Otherwise, processing then proceeds to processing block 88 in which a committed tag tc is updated to tag and all outstanding read requests are served with a tag-pair value (tc,vc) having a treq value which is less than or equal to the committed tag value tc. As also illustrated in processing block 88, these reads are removed from the list of outstanding read requests. Further, and as also illustrated in processing block 88, the values associated with tag-value pairs in the list for tags which are less than the value of tc, are removed. Processing then proceeds to processing block 90 in which the edge layer server offloads the tag-value pair to permanent storage in the backend layer $\mathcal{L}_2$. This may be accomplished, for example, by the server initiating a write-to-L2 action as described above).

Processing then proceeds to decision block 92 in which a decision is made as to whether the server completed the internal write-to-L2 operation. Although block 92 is illustrated as a decision block which implements a loop, in practice, this would be implemented as an interrupt driven procedure and thus processing block 94 would be implemented only upon completion of an internal write-to-L2 operation.

Once the sever completes the internal write-to-L2 operation, then processing flows to processing block 94 in which the edge-layer node server removes the value associated with the write operation from its temporary storage. Optionally, the server may also clear any old entries from its list. Processing then ends.

A read operation is described below in conjunction with FIGS. 4-4J.

Figure 4:
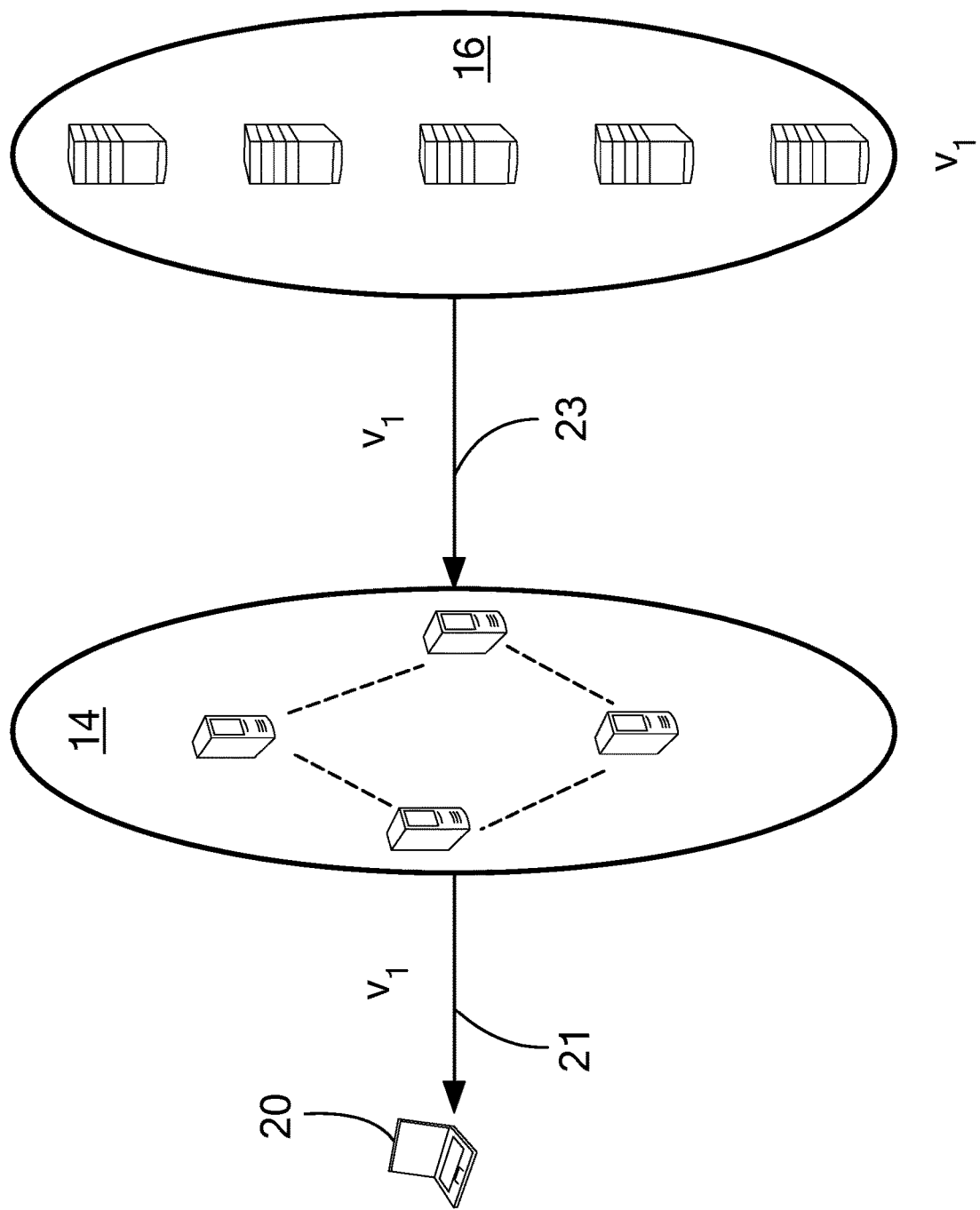
FIG. 4 is a schematic diagram of a reader client reading content from a backend layer server through an edge layer server.

Referring now to FIG. 4, a reader node 20 wishes to retrieve content $v_1$. In general overview, during a read operation, reader 20 gets served tag-value pairs (t,v) from temporary storage in the edge layer $\mathcal{L}_1$, if it overlaps with concurrent write or internal write-to-L2 operations. If not, servers in the edge layer $\mathcal{L}_1$ regenerate tag-coded-element pairs via regenerate-from-L2 operations (to be described below), which are then sent to the reader 20.

Figure 4A:
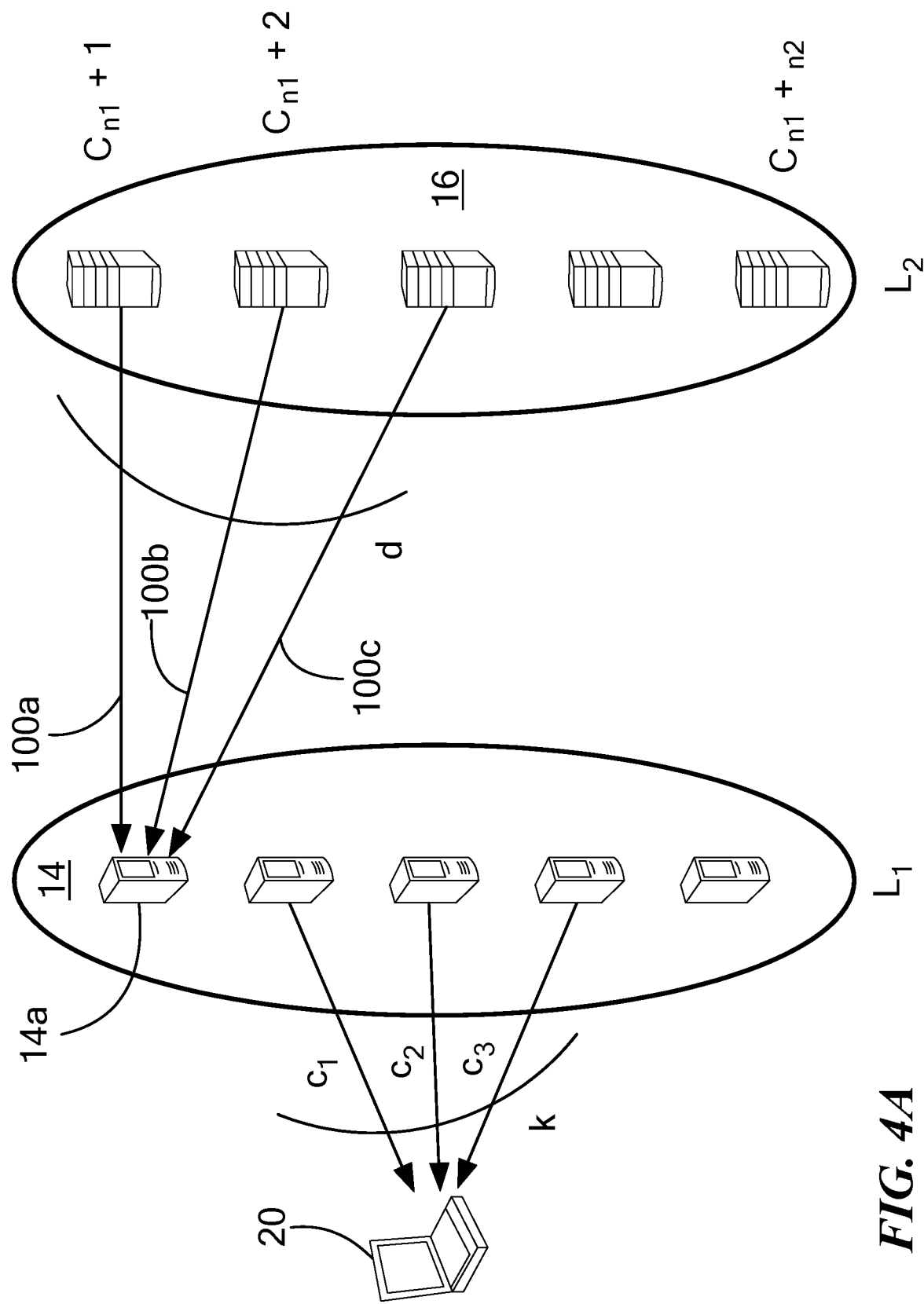
FIG. 4A is a schematic diagram illustrating a read operation from coded content.
Figure 4B:
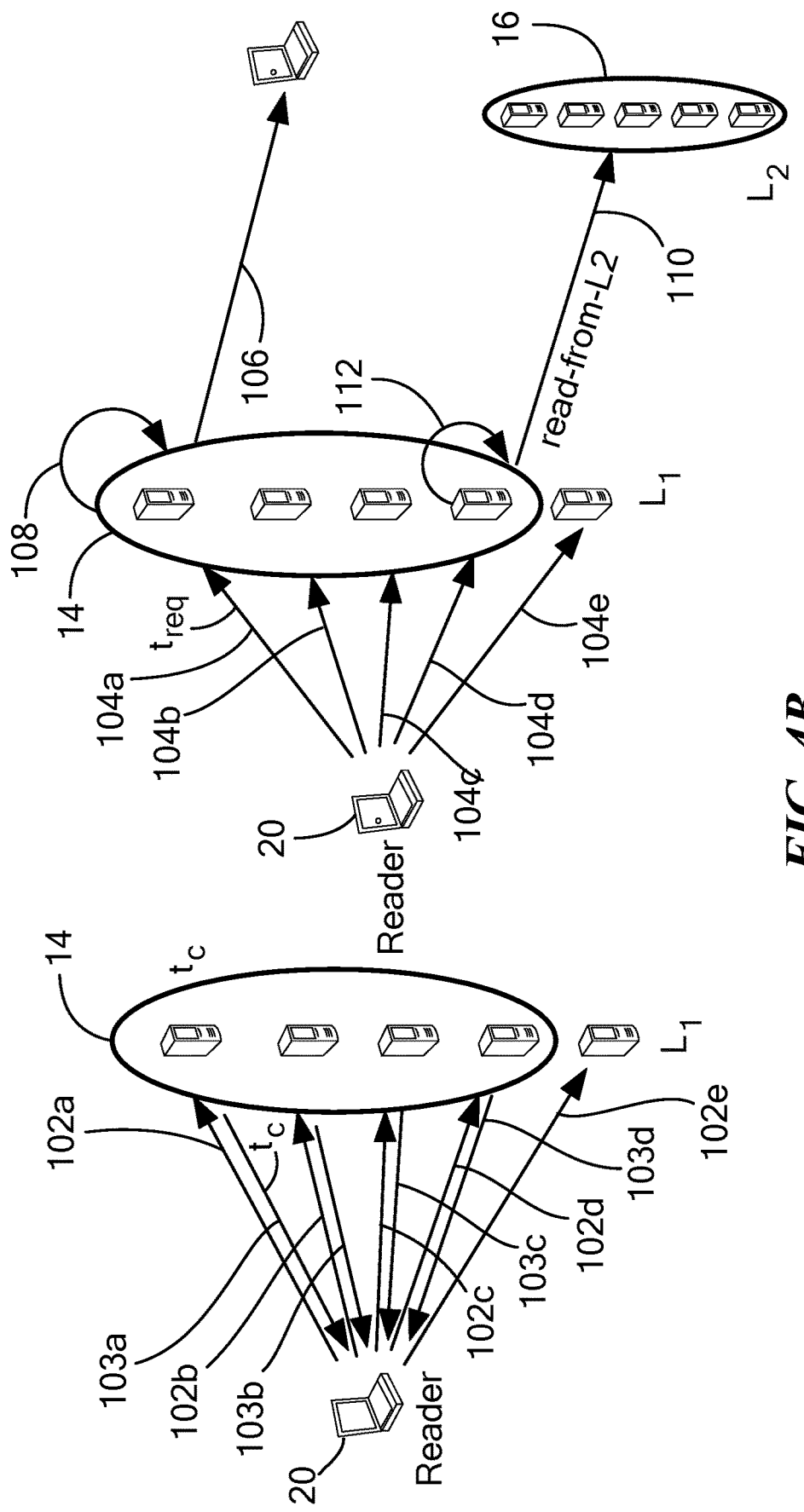
FIG. 4B is a schematic diagram illustrating two phases of a read operation from a backend layer server.

Referring now to FIG. 4A, in the case where edge layer servers regenerate tag-coded element pairs, so-called "nodes" 16 provide portions of coded content, an edge layer helper server (e.g. server 14a) and the reader 20 needs to decode the value v using the code $C_1$. Referring now to FIG. 4B, in embodiments, a read operation comprises three phases: a "get committed tag" phase; a "get-data" phase; and a "put-tag" phase.

During the first or "get committed tag" phase, the reader identifies the minimum tag, treq, whose corresponding value it can return at the end of the operation.

During the second or "get-data" phase, the reader sends treq to all the servers in $\mathcal{L}_1$, awaits responses from $f_1+k$ distinct servers such that 1) at least one of the responses contains a tag-value pair, say $(t_r,v_r)$ or 2) at least k of the responses contains coded elements corresponding to some fixed tag, say $t_r$ such that $t_r \geq treq$. In the latter case, the reader uses the code $C_2$ to decode the value $v_r$ corresponding to tag $t_r$. A server $s \in \mathcal{L}_1$ upon reception of the get-data request checks if either (treq, vreq) or $(t_c,v_c)$; $t_c > treq$ is its list; in this case, s responds immediately to the reader with the corresponding pair. Otherwise, s adds the reader to its list of outstanding readers, initiates a regenerate-from-L2 operation in which s attempts to regenerate a tag-coded data element pair (t'; c'$_s$); t'≥treq via a repair process taking help from servers in $\mathcal{L}_2$. If regeneration from ⊥ fails, the server s simply sends (⊥,⊥) back to the reader.

It should be noted that irrespective of whether the regeneration operation succeeds, the server does not remove the reader from its list of outstanding readers. In the LDS technique the server s is allowed to respond to a registered reader with a tag-value pair, during the broadcast-resp action as well. It is possible that while the server awaits responses from $\mathcal{L}_2$ towards regeneration, a new tag t gets committed by s via the broadcast-resp action; in this case, if t≥$t_c$, server s sends (t,v) to r, and also unregisters r from its outstanding reader list.

Figure 4C:
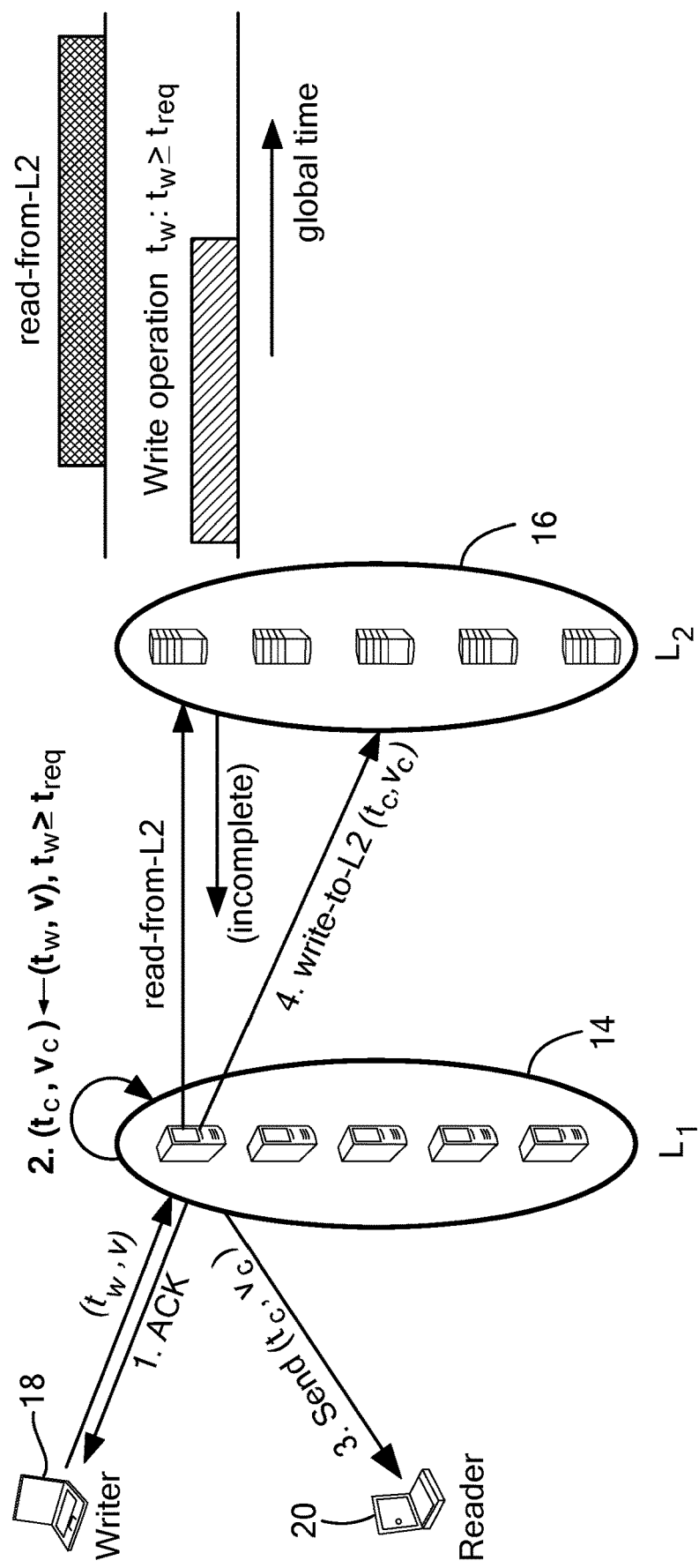
FIG. 4C is a schematic diagram illustrating four possibilities of a read operation from backend layer servers (aka "a read-from-L2" action)

Referring now to FIG. 4C, there are four possibilities resulting from a read-from-L2 operation. A first possibility is that a server commits a tag-value pair $(t_c,v_c)$ as part of a concurrent write operation such that $t_c$ is ≥treq. In this case, the server sends the tag-value pair $(t_c,v_c)$ to the reader and unregisters the reader (does not wait for read-from-L2 response).

A second possibility is that the server regenerates a tag-value pair $(t,c_1)$ such that t is ≥treq. In this case the server sends the tag-value pair $(t,c_1)$ to the reader and does not unregister the reader.

A third possibility is that the server regenerates a tag-value pair $(t,c_1)$ such that t is <treq. In this case, the server sends the null set tag-value pair $(\bot, \bot)$ to the reader and does not unregister the reader.

A fourth possibility is that the server does not regenerate any tag-coded element pair (tag, coded-element) due to concurrent write-to-L2 actions. In this case, the server sends the null set tag-value pair $(\bot, \bot)$ to the reader and does not unregister the reader.

It should be appreciated that the reader expects responses from a predetermined number of servers (e.g. $f_1+k$ servers) such that either one of them is tag-value pair (tag, value) in which tag≥treq or a predetermined number of them (e.g. k of them) are tag-coded element pairs for the same tag, i.e. tag≥treq (decode value in this case).

Figure 4D:
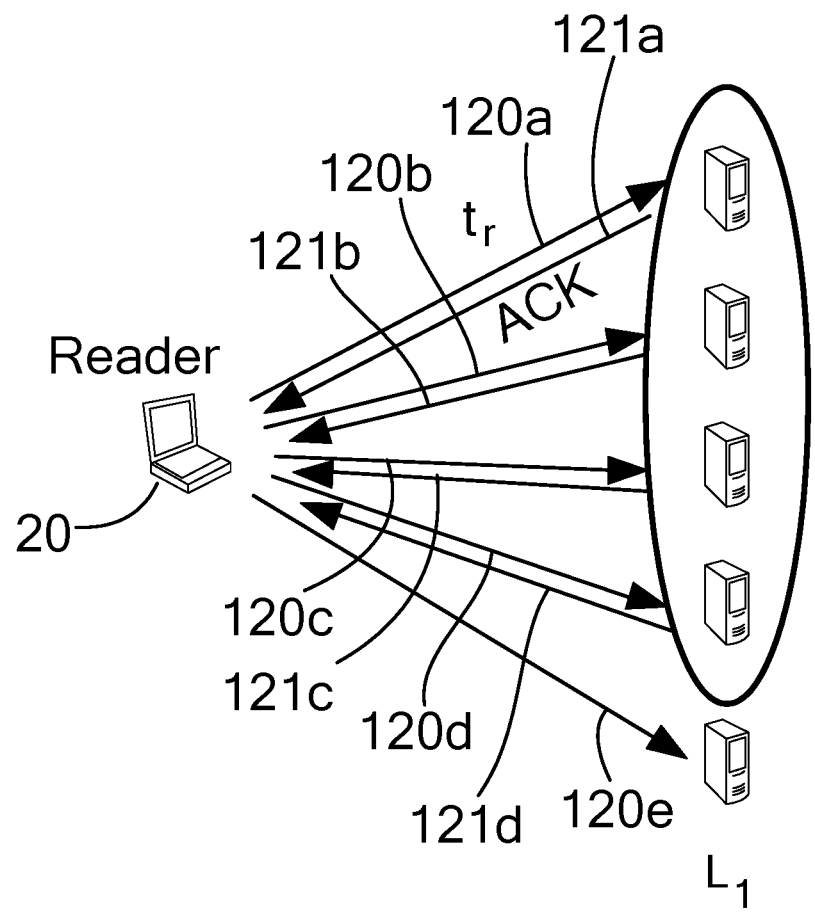
FIG. 4D is a schematic diagram illustrating a third phase of a read operation.

Referring now to FIG. 4D, in the third phase, the reader writes-back tag $t_r$ corresponding to a returned value $v_r$, and ensures that at least $f_1+k$ servers in $\mathcal{L}_2$ have their committed tags at least as high as $t_r$, before the read operation complete. However, the value $v_r$ is not written back in this third phase, and this is important to decrease the read cost. The third phase also helps in unregistering the reader from the servers in $\mathcal{L}_1$.

Figure 4E:
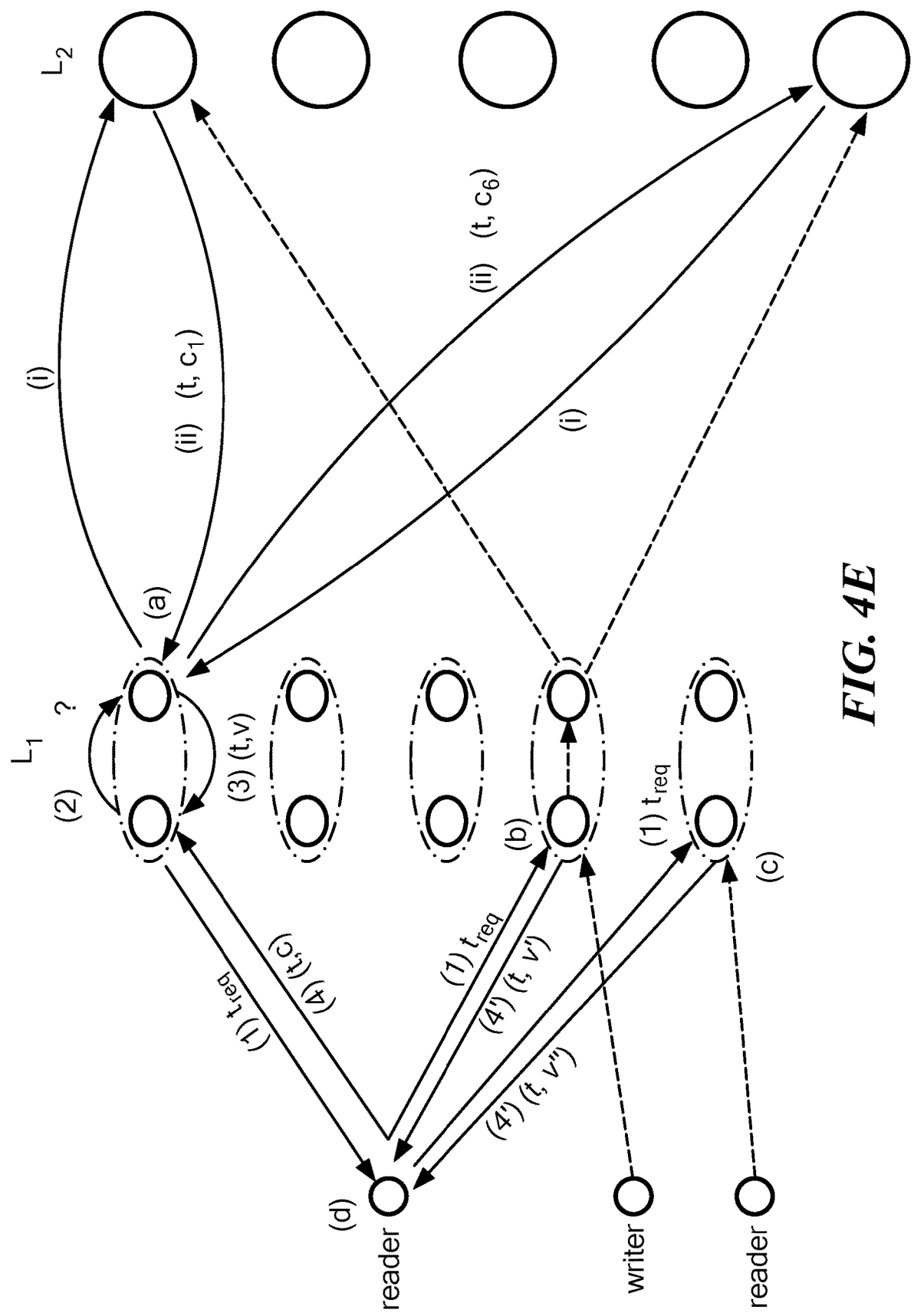
FIG. 4E is a schematic diagram illustrating read operations between a reader client, edge layer servers and backend layer servers.

Referring now to FIG. 4E, the overall read operation is shown. A reader performs a "get-committed tag" operation in which the reader sends QUERY-COMM-TAG to servers in the edge layer $\mathcal{L}_1$. The reader then awaits $f_1+k$ responses, and selects highest tag, say treq. The reader also performs a "get-data" operation in which the reader sends (QUERY-DATA; treq) to servers in $\mathcal{L}_1$ and awaits responses from $f_1+k$ servers such that at least one of them is a (tag, value) pair, or at least k of them are (tag, coded-element) pairs corresponding to some common tag. In the latter case, decode corresponding value using code $C_1$. Select the $(t_r; v_r)$ pair corresponding to the highest tag, from the available (tag, value) pairs. The reader also performs a put-data operation in which the reader sends (PUT-TAG, $t_r$) to servers in the edge layer $\mathcal{L}_1$ and awaits responses from $f_1+k$ servers in $\mathcal{L}_1$ and then returns the requested value $v_r$.

Figure 4F:
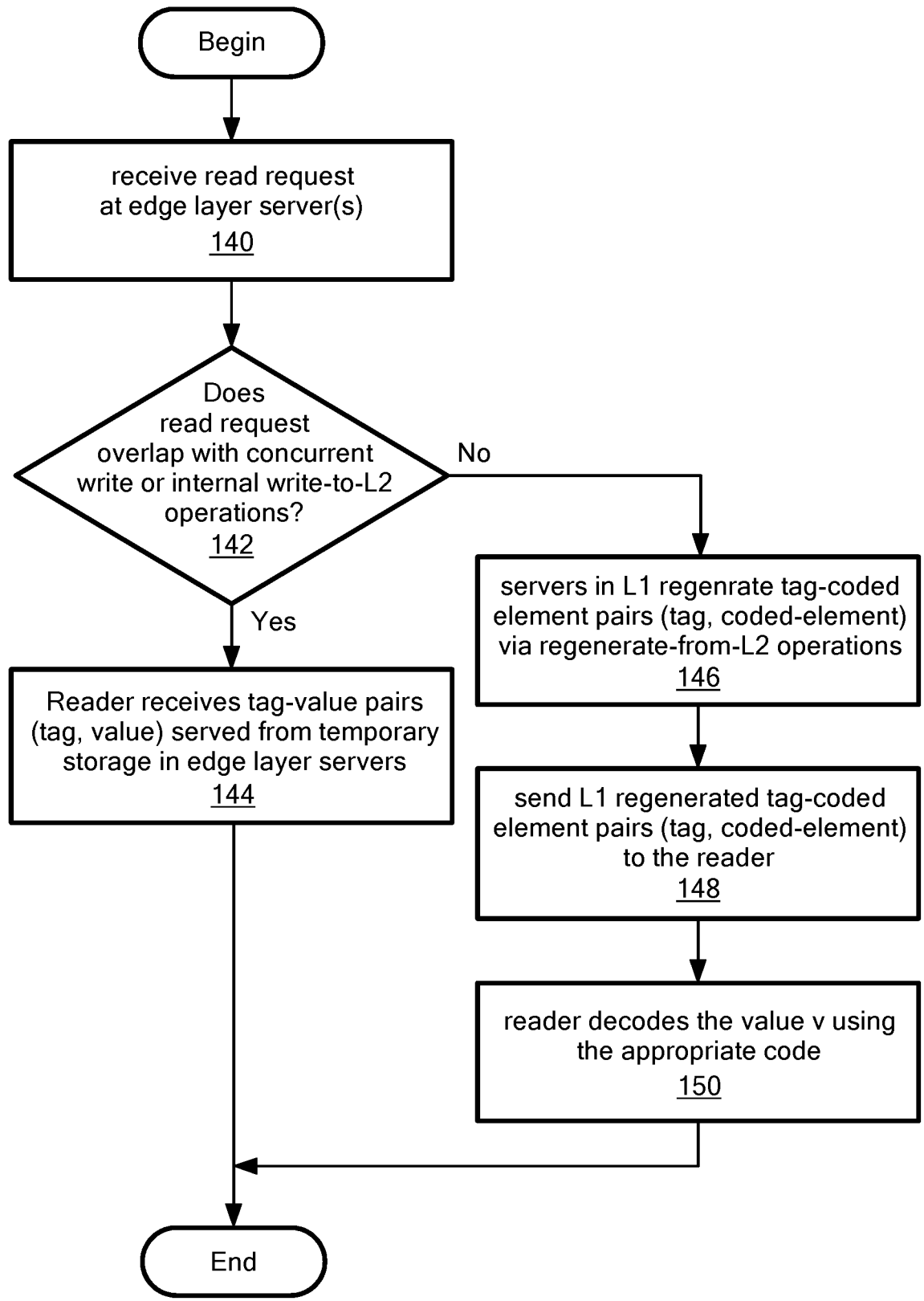
FIG. 4F is a flow diagram of a read operation.
Figure 4G:
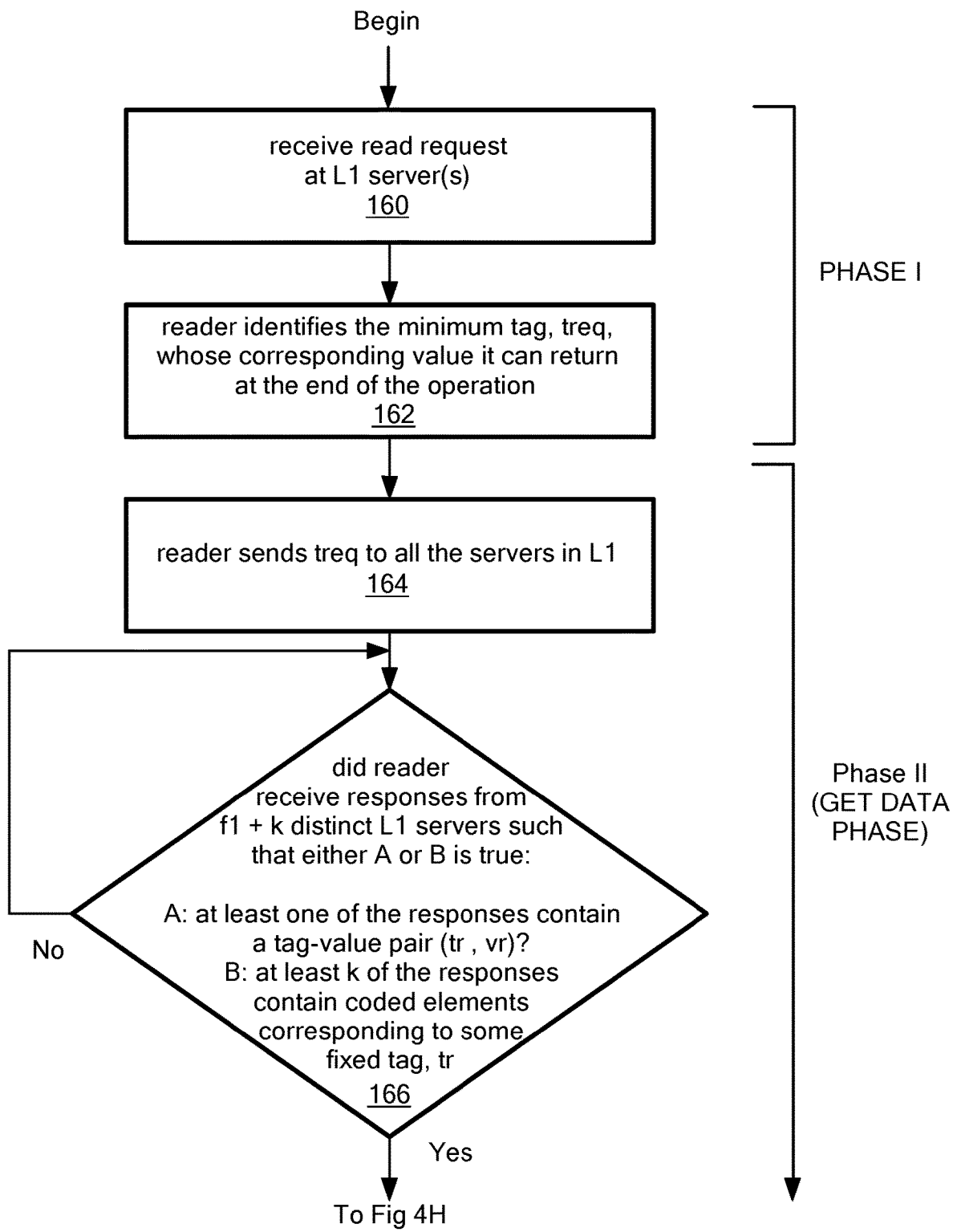
FIGS. 4G-4J are a series of flow diagrams illustrating various phases of a read operation.
Figure 4H:
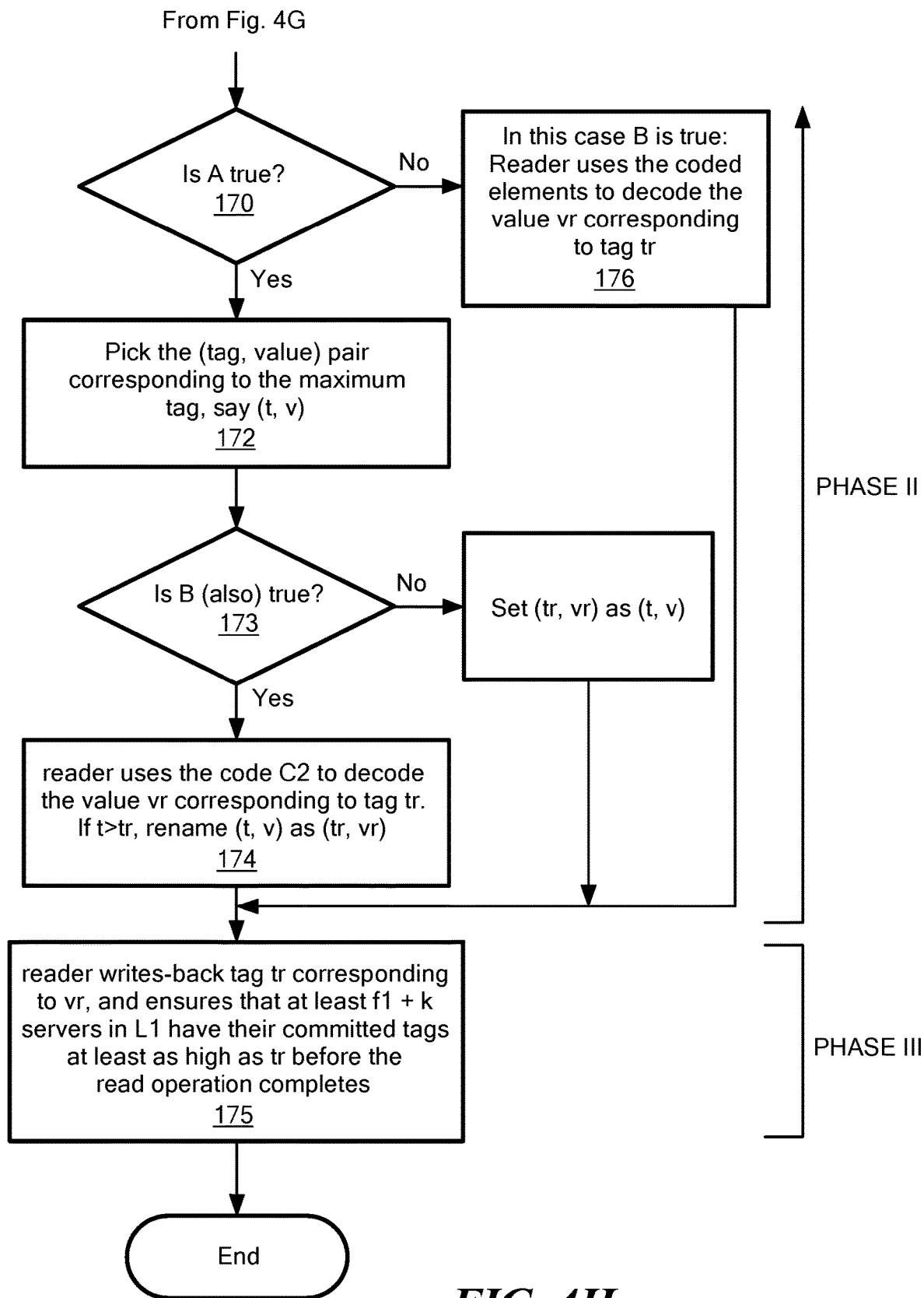

Referring now to FIG. 4F, in general overview, a read operation begins as shown in processing block 140, in which a read request is received at one or more edge layer servers. Processing then proceeds to decision block 142 in which a decision is made as to whether there exists an overlap with a concurrent write operation or an internal write-to-L2 operation. If a decision is made that an overlap exists, then processing proceeds to processing block 144 in which the reader receives tag-value pairs (t,v) served from temporary storage of one or more servers in the edge layer $\mathcal{L}_1$ (e.g. from temporary storage in one or more of the edge layer servers).

If in decision block 142 a decision is made that no overlap exists, then processing proceeds to processing block 146 in which one or more servers in the edge layer $\mathcal{L}_1$, regenerate tag-coded element pairs (tag, coded-element). In this scenario, the edge layer servers utilize information from the backend layer servers. This may be accomplished, for example, via regenerate-from-L2 operations as described above in conjunction with FIG. 4C. Edge layer regenerated tag, coded-element pairs are then sent to the reader.

Processing then proceeds to processing block 150 where the reader decodes the value V using the appropriate code. Processing then ends.

Referring now to FIGS. 4G-4J, a read operation comprises three phases with a first phase beginning at processing block 160 in which a read request is received at one or more edge layer servers. Processing then proceeds to processing block 162, in which the reader identifies the minimum tag treq whose corresponding value it can return at the end of the operation. A "minimum tag" refers to the smallest tag as define D by the rules of tag comparison explained above. This concludes the phase I processing.

The phase II processing begins in processing block 164 in which the reader sends the minimum tag value treq to all of the servers in the edge layer.

Processing then proceeds to decision block 166 in which a decision is made as to whether the reader received responses from a predetermined number of distinct edge layer servers (including itself) such that at least one of the following conditions is true: (A) responses contain a tag-value pair $(t_r,v_r)$ or (B) at least one of the responses contain coded elements corresponding to some fixed tag $t_r$. That is, some tag greater than or equal to the requested tag (which may or may not be the requested tag-value pair), which means that the tag-value pair was stored in that servers local storage) or must return coded elements (which means that no appropriate tag-value pair was stored in that server's local storage and thus the server had to communicate with I2 to get coded elements). In embodiments, the predetermined number of distinct edge layer servers may be at least $f_1+k$ distinct edge layer servers.

Once one of the conditions is true, then decision blocks 170 and 173 determine which of the conditions A or B is true. If in decision block 170 a decision is made that condition A is not true, then condition B must be true and processing proceeds to block 176 the reader uses the coded elements to decode the value vr corresponding to tag tr. Processing then proceeds to block 175 where the reader writes back tag tr corresponding to value $_{vr}$, and ensures that at least $f_1+k$ servers $\mathcal{L}_1$ have their committee tags at least as high as tr, before the read operation completes.

If in decision block 170 a decision is made that condition A is true, processing proceeds to block 172 where a tag-value pair is selected corresponding to the most recent (or "maximum") tag. Processing then proceeds to decision block 173 in which a decision is made as to whether condition B is also true. If condition B is not also true, then the tag-value pair (tr,vr) is set as the tag-value pair (t,v). Processing then proceeds to block 175 as above.

If in decision block 173 a decision is made that condition B is also true, then processing proceeds to block 174 where the reader uses the code C2 to decode the value vr corresponding to tag tr and if the tag t is more recent that the tag tr, then the tag-value pair (t,r) is renamed as (tr,vr) (i.e. f t>tr, rename (t,v) as (tr,vr)).

Figure 4I:
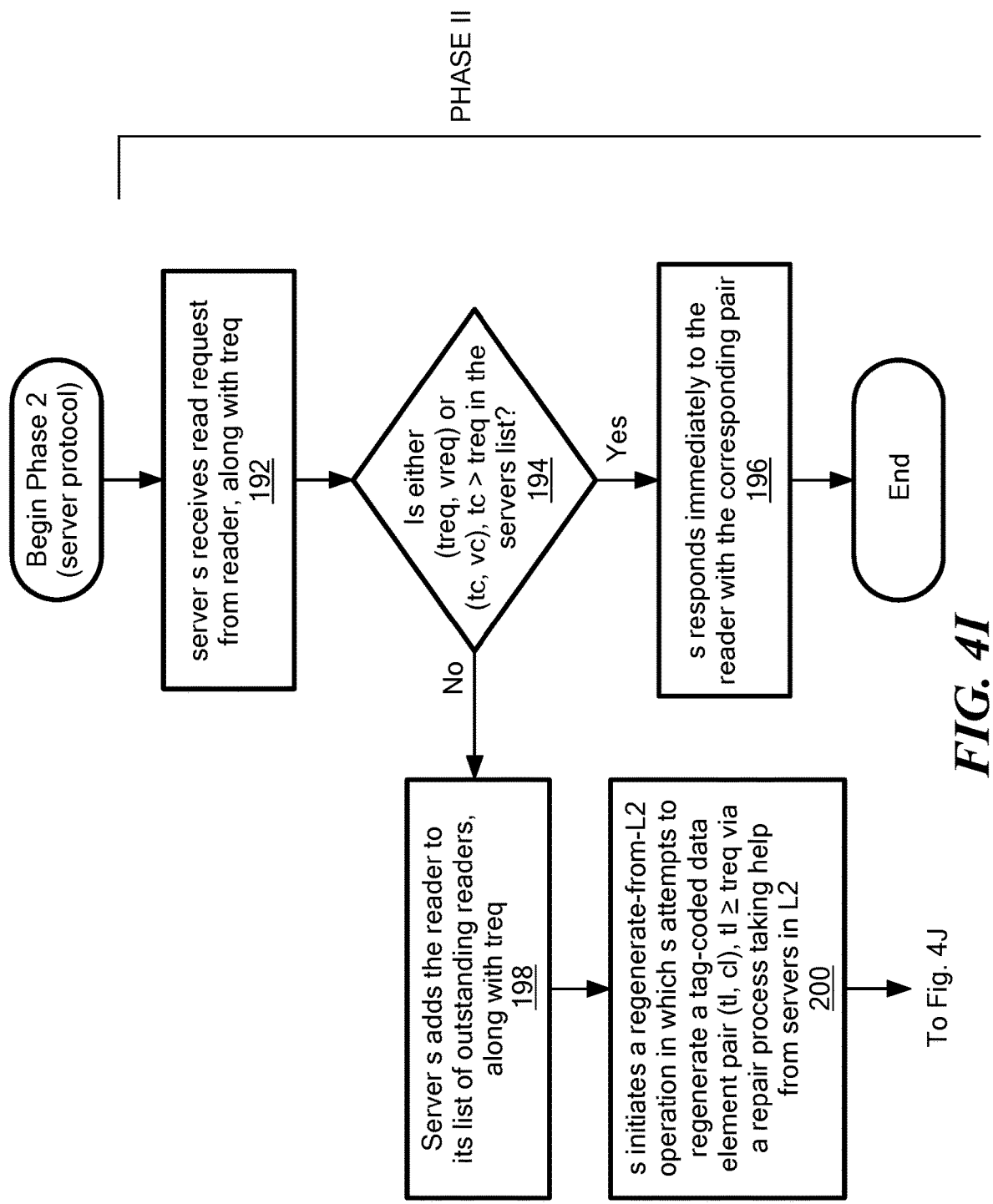
Figure 4J:
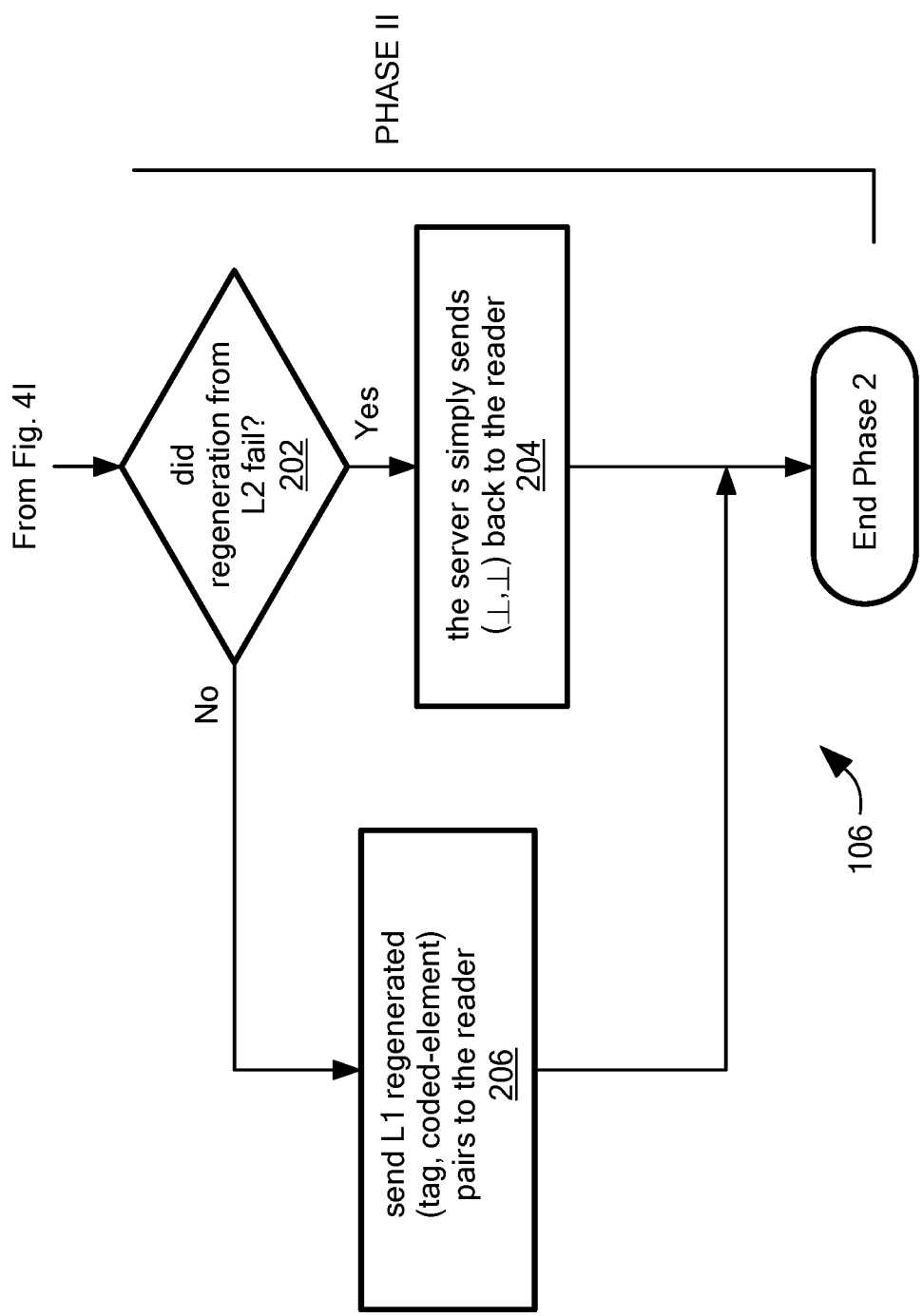

Referring now to FIG. 4I, an illustrative phase two server protocol begins in block 192 in which a server s receives a read request from a reader along with a tag request treq. Processing then flows to decision block 194 in which a decision is made as to whether (treq, vreq) or (tc, vc) tc>treq is in the servers list? If one of the conditions in true, server s responds immediately to the reader with the corresponding tag-value pair as shown in processing block 196. Processing then ends.

If the condition in decision block 194 is not true, then processing proceeds to block 198 in which the server s adds the reader to its list of outstanding readers, along with treq. Processing then proceeds to processing block 200 in which server s initiates a regenerate-from −L2 operation in which the server s attempts to regenerate a tag-coded data element pair (tl,cl), tl≥treq via a repair process taking help from servers in $\mathcal{L}_2$.

Processing then proceeds to decision block 202 in which a decision is made as to whether regeneration from the backend layer $\mathcal{L}_2$ failed. If the regeneration failed, then processing flows to block 204 in which the server s simply sends a null set $(\perp,\perp)$ back to the reader. It should be noted that irrespective of whether regeneration succeeds, the server does not remove the reader from its list of outstanding readers. That is, even though individual regenerations succeed, the regeneration might not succeed in a collection of k servers in the edge such that all these servers regenerate the same tag. This happens because of concurrent write operations. In such situation, by not removing the reader from the list of outstanding readers of a server, we allow the server to relay a value directly to the server (even after individual successful regeneration, but collective failure) so that the read operation eventually completes. Phase two processing then ends.

If in decision block 202 a decision is made that the regeneration did not fail, then processing flows to block 206 in which edge layer $\mathcal{L}_1$ regenerated tag-coded-element pairs are sent to the reader. Phase two processing then ends.

Below are described several interesting properties of the LDS technique. These may be found useful while proving the liveness and atomicity properties of the algorithm. The notation $S_a \subset \mathcal{L}_1$, $|S_a|=f_1+k$ is used to denote the set of $f_1+k$ servers in $\mathcal{L}_1$ that never crash fail during the execution. Below are lemmas only applicable to servers that are alive at the concerned point(s) of execution appearing in the lemmas.

For every operation π in Π corresponding to a non-faulty reader or writer, there exists an associated (tag, value) pair that denoted as (tag(π), value(π))). For a write operation π, we the (tag(π), value(π))) pair may be defined as the message $(t_w,v)$ which the writer sends in the put-data phase. If TT is a read, the (tag(π), value (π))) pair is defined as $(t_r,v)$ where v is the value that gets returned, and $t_r$ is the associated tag. In a similar manner tags may also be defined for those failed write operations that at least managed to complete the first round of the write operation. This is simply the tag $t_w$ that the writer would use during a put-data phase, if it were alive. As described, writes that failed before completion of the first round are ignored.

For any two points $T_1$, $T_2$ in an execution of LDS, we say $T_1<T_2$ if $T_1$ occurs earlier than $T_2$ in the execution. The following three lemmas describe properties of committed tag $t_c$, and tags in the list.

Lemma IV.1 (Monotonicity of committed tag). Consider any two points $T_1$ and $T_2$ in an execution of LDS, such that $T_1<T_2$. Then, for any server $s \in \mathcal{L}_1$, $s.tc|_{T1} \geq s.tc|_{T2}$.

Lemma IV.2 (Garbage collection of older tags). For any server $s \in \mathcal{L}_1$, at any point T in an execution of LDS, if (t, v)∈s.L, we have t≥s.tc.

Lemma IV.3 (Persistence of tags corresponding to completed operations). Consider any successful write or read operation φ in an execution of LDS, and let T be any point in the execution after φ completes. For any set S' of $f_1+k$ servers in $\mathcal{L}_1$ that are active at T, there exists s∈S' such that $s.t_{c|T} \geq tag(\varphi)$ and max $\{t:(t;*)\in s.L|_T\} \geq tag(\varphi)$.

The following lemma shows that an internal regenerate-from-L2 operation respects previously completed internal write-to-L2 operations. Our assumption that $f_2<n_2/3$ is used in the proof of this lemma.

Lemma IV.4 (Consistency of Internal Reads with respect to Internal Writes). Let $\sigma_2$ denote a successful internal write-to-L2(t,v) operation executed by some server in $\mathcal{L}_1$. Next, consider an internal regenerate-from-L2 operation $_{\pi 2}$, initiated after the completion of $\sigma_2$, by a server $s \in \mathcal{L}_1$ such that a tag-coded-element pair, say (t',c') was successfully regenerated by the server s. Then, t'≥t; i.e., the regenerated tag is at least as high as what was written before the read started.

The following three lemmas are central to prove the liveness of read operations.

Lemma IV.5 (If internal regenerate-from-L2 operation fails). Consider an internal regenerate-from-L2 operation initiated at point T of the execution by a server $s_1 \in \mathcal{L}_1$ such that s1 failed to regenerate any tag-coded-element pair based on the responses. Then, there exists a point e in the execution such that the following statement is true: There exists a subset $S_b$ of $S_a$ such that $|S_b|=k$, and $\forall s' \in S_b$ ( )∈s'. where=ma$X_{s \in \mathcal{L}_1}$s.tc.

Lemma IV.6 (If internal regenerate-from-L2 operation regenerates a tag older than the request tag). Consider an internal regenerate-from-L2 operation initiated at point T of the execution by a server $s_1 \in \mathcal{L}_1$ such that $s_1$ only manages to regenerate (t,c) based on the responses, where t<treq. Here treq is the tag sent by the associated reader during the get-data phase. Then, there exists a point in the execution such that the following statement is true: There exists a subset $S_b$ of $S_a$ such that $|S_b|=k$, and $\forall s' \in S_b$ ( )∈s' . . . where=ma$X_{s \in \mathcal{L}_1}$ s.$t_c$.

Lemma IV.7 (If two Internal regenerate-from-L2 operations regenerate differing tags). Consider internal regenerate-from-L2 operations initiated at points T and T' of the execution, respectively by servers s' and s' in $\mathcal{L}_1$. Suppose that s and s' regenerate tags t and t' such that t<t'. Then, there exists a point in the execution such that the following statement is true: There exists a subset $S_b$ of $S_a$ such that $|S_b|=k$, and $\forall s' \in S_b$ ( )∈s' . . . where=ma$X_{s \in \mathcal{L}_1}$ s.$t_c$.

Theorem IV.8 (Liveness). Consider any well-formed execution of the LDS algorithm, where at most $f_1<n_1/2$ and $f_2<n_2/3$ servers crash fail in layers $\mathcal{L}_1$ and $\mathcal{L}_2$, respectively. Then every operation associated with a non-faulty client completes.

Theorem IV.9 (Atomicity). Every well-formed execution of the LDS algorithm is atomic.

Storage and communication costs associated with read/write operations, and also carry out a latency analysis of the algorithm, in which estimates for durations of successful client operations are provided. We also analyze a multi-object system, under bounded latency, to ascertain the contribution of temporary storage toward the overall storage cost. We calculate costs for a system in which the number of nodes in the two layers are of the same order, i.e., $n_1=\Theta(n_2)$. We further assume that the parameters k,d of the regenerating code are such that $k=\Theta(n_2)$; $d=\Theta(n_2)$. This assumption is consistent with usages of codes in practical systems.

In this analysis, we assume that corresponding to any failed write operation π, there exists a successful write operation π' such that tag(π')>tag(π). This essentially avoids pathological cases where the execution is a trail of only unsuccessful writes. Note that the restriction on the nature of execution was not imposed while proving liveness or atomicity.

Lemma V.1 (Temporary Nature of $\mathcal{L}_1$ Storage). Consider a successful write operation π∈β. Then, there exists a point of execution $T_e(\pi)$ in β such that for all $T' \geq T_e(\pi)$ in β, we have s.$t_c|_{T'} \geq tag(\pi)$ and $(t,v) \notin s.L|_{T'}$, $\forall S \in \mathcal{L}_1$, t≤tag(π).

For a failed write operation π∈β let π' be the first successful write in β such that tag(π')>tag(π). Then, it is clear that for all $T' \geq T_e$ (π') in β, we have $(t,v) \notin s.L|_{T'}$, $\forall s \in \mathcal{L}_1$, t≤tag(π), and thus Lemma V.1 indirectly applies to failed writes as well. Further, for any failed write π∈β, we define the termination point $T_{end}(\pi)$ of π as the point $T_e(\pi')$ obtained from Lemma V.1, where π'.

Definition 1 (Extended write operation). Corresponding to any write operation $\pi \in \beta$, we define a hypothetical extended write operation $\pi_e$ such that $\text{tag}(\pi_e) = \text{tag}(\pi)$, $T_{start}(\pi_e) = T_{start}(\pi)$ and $T_{end}(\pi_e) = \max(T_{end}(\pi); T_e(\pi))$, where $T_e(\pi)$ is as obtained from Lemma V.1.

The set of all extended write operations in $\beta$ shall be denoted by $\Pi_e$.

Definition 2 (Concurrency Parameter $\delta_\rho$). Consider any successful read operation $\rho \in \beta$, and let $\pi_e$ denote the last extended write operation in $\beta$ that completed before the start of $\rho$. Let $\Sigma = \{\sigma_e \in \Pi_e \backslash \text{tag}(\sigma) > \text{tag}(\pi_e) \text{ and } \sigma_e \text{ overlaps with } \rho\}$. We define concurrency parameter $\delta_\rho$ as the cardinality of the set $\Sigma$.

Lemma V.2 (Write, Read Cost). The communication cost associated with any write operation in $\beta$ is given by $n_1 + n_1 n_2 = \Theta(n_1)$. The communication cost associated with any successful read operation pin $\rho$ in $\beta$ is given by $n_1(1+) + n_1 I(\delta_\rho > 0) = \Theta(1) + n_1 I(\delta_\rho > 0)$. Here, $I(\delta_\rho > 0)$ is 1 if $\delta_\rho 0$, and 0 if $\delta_\rho = 0$.

It should be noted that the ability to reduce the read cost to $\Theta(1)$ in the absence of concurrency from extended writes comes from the usage of regenerating codes at MBR point. Regenerating codes at other operating points are not guaranteed to give the same read cost, depending on the system parameters. For instance, in a system with equal number of servers in either layer, also with identical fault-tolerance (i.e., $n_1 = n_2$; $f_1 = f_2$), it can be shown that usage of codes at the MSR point will imply that read cost is $\Omega(n_1)$ even if $\delta_\rho = 0$.

Lemma V.3 (Single Object Permanent Storage Cost). The (worst case) storage cost in $\mathcal{L}_2$ at any point in the execution of the LDS algorithm is given by $= \Theta(1)$.

Remark 2. Usage of MSR codes, instead of MBR codes, would give a storage cost of $= \Theta(1)$. For fixed $n_2$; k,d, the storage-cost due to MBR codes is at most twice that of MSR codes. As long as we focus on order-results, MBR codes do well in terms of both storage and read costs; see Remark 1 as well.

For bounded latency analysis, delay on the various point-to-point links are assumed to be upper bounded as follows: 1) $T_1$, for any link between a client and a server in $\mathcal{L}_1$, 2) $T_2$, for any link between a server in $\mathcal{L}_1$ and a server in $\mathcal{L}_2$, and 3) T0, for any link between two servers in $\mathcal{L}_1$. We also assume the local computations on any process take negligible time when compared to delay on any of the links. In edge computing systems, $T_2$ is typically much higher than both $T_1$ and $T_0$.

Lemma V.4 (Write, Read Latency). A successful write operation in $\beta$ completes within a duration of $4_{T1} + 2_{T0}$. The associated extended write operation completes within a duration of $\max(3_{T1} + 2_{T0} + 2_{T2}; 4_{T1} + 2_{T0})$. A successful read operation in _ completes within a duration of $\max(6_{T1} + 2_{T2}; 5_{T1} + 2_{T0} + 2_{T2})$.

1) Impact of Number of Concurrent Write Operations on Temporary Storage, via Multi-Object Analysis: Consider implementing N atomic objects in the two-layer storage system described herein, via N independent instances of the LDS algorithm. The value of each of the objects is assumed to have size 1. Let $\theta$ denote an upper bounded on the total number of concurrent extended write operations experienced by the system within any duration of $T_1$ time units. Under appropriate conditions on $\theta$, it may be shown that the total storage cost is dominated by that of permanent storage in $\mathcal{L}_2$. The following simplifying assumptions are made: 1) system is symmetrical so that $n_1 = n_2$; $f_1 = f_2 (\Rightarrow k = d)$ 2) $_{T0} = _{T1}$, and 3) all the invoked write operations are successful. It should be noted that it is possible to relax any of these assumptions and give a more involved analysis. Also, let $\mu = _{T2/T1}$.

Lemma V.5 (Relative Cost of Temporary Storage). At any point in the execution, the worst case storage cost in $\mathcal{L}_1$ and $\mathcal{L}_2$ are upper bounded by $[5+2\mu] \theta_{n1}$ and. Specifically, if $\theta \ll$, the overall storage cost is dominated by that of permanent storage in $\mathcal{L}_2$, and is given by $\theta(N)$.

Described above is a two-layer model for strongly consistent data-storage which supports read/write operations. The system and LDS techniques described herein were motivated by the proliferation of edge computing applications. In the system, the first layer is closer (in terms of network latency) to the clients and the second layer stores bulk data. In the presence of frequent read and write operations, most of the operations are served without the need to communicate with the backend layer, thereby decreasing the latency of operations. In that regard, the first layer behaves as a proxy cache. As described herein, in one embodiment regenerating codes are used to simultaneously optimize storage and read costs. In embodiments, it is possible to carry out repair of erasure-coded servers in the backend layer $\mathcal{L}_2$. The modularity of implementation possibly makes the repair problem in the backend of layer $\mathcal{L}_2$ simpler than in prior art systems. Furthermore, it is recognized that the modularity of implementation could be advantageously used to implement a different consistency policy like regularity without affecting the implementation of the erasure codes in the backend. Similarly, other codes from the class of regenerating codes including, but not limited to the use of random linear network codes (RLNCs) in the backend layer, may also be used without substantially affecting client protocols.

What is claimed is:

1. A method for use in a network having an edge layer and a backend layer, the edge layer including a first edge server and a plurality of second edge servers, and the backend layer including a plurality of backend servers, the method comprising:

receiving, by the first edge server, a first value-tag pair that corresponds to a content item, the first value-tag pair being received from a writer, the first value-tag pair including a first representation of the content item and a first tag;

transmitting a first reception notification message indicating that the first value-tag pair has been received by the first edge server, the first reception notification message being transmitted from the first edge server to the plurality of second edge servers;

receiving by the first edge server, a plurality of second reception notification messages, each second reception notification message being transmitted by a different one of the plurality of second edge servers and indicating that the second edge server has also received the first value-tag pair from the writer;

generating, by the first edge server, a first coded data item based on the first value-tag pair by using regeneration coding, the first coded data item encoding only a portion of the first representation of the content item; and transmitting the first coded data item from the first edge server to a given one of the plurality of backend servers, wherein the first coded data item is generated and transmitted to the given backend server only when a predetermined count of second reception notification messages is received at the first edge server.

2. The method of claim 1, further comprising:
storing the first value-tag pair in a local storage of the first edge server, the first value-tag pair being stored in the local storage after the predetermined count of second reception notification messages is received and before the first code data item is generated; and
transmitting, by the first edge server, an acknowledgement to the writer indicating that the first edge server has received the value tag pair, the acknowledgement being transmitted after the predetermined count of second reception notification messages is received and before the first coded data item is generated.

3. The method of claim 1, wherein the first edge server is configured to wait until the predetermined count of second reception notification messages is received at the first edge server before generating and transmitting the first coded data item.

4. The method of claim 1, further comprising receiving, by the first edge server, a second value-tag pair that corresponds to the content item, wherein:
the second value-tag pair includes a second representation of the content item and a second tag,
the first representation of the content item and the second representation of the content item are different versions of the content item, and
the first coded data item is generated and transmitted only when the first representation is a more recent version of the content item than the second representation.

5. The method of claim 1, further comprising:
receiving, by the first edge server, a second value-tag pair that corresponds to the content item, the second value-tag pair including a second representation of the content item and a second tag, the first tag including a first value-tag pair identifier and a first writer identifier, and the second tag including a second value-tag pair identifier and a second writer identifier,
detecting, by the first edge server, whether the first tag is greater than the second tag by: comparing the first value-tag pair identifier to the second value-tag pair identifier, and comparing the first writer identifier to the second writer identifier,
when the second tag is greater than the second tag: generating, by the first edge server, a second coded data item based on the second value-tag pair by using regeneration coding, and transmitting the second coded data item from the first edge server to the given backend server,
wherein the second coded data item encodes only a portion of the second representation of the content item, and
wherein the first coded data item is generated and transmitted when the first tag is greater than the second tag.

6. The method of claim 1, wherein the first reception notification message is transmitted using a primitive broadcast protocol that guarantees that if the first reception notification message is received by one of the plurality of second edge servers, the first reception notification message will also be received by all remaining non-faulty ones of the plurality of second edge servers.

7. The method of claim 1, further comprising:
receiving a read request for the content item that includes a request tag, the read request being received at the first edge server from a reader;
comparing the request tag to the first tag; and
retrieving the first coded data item from the given backend server and transmitting the first coded data item to the reader,
wherein the first coded data item is retrieved from the given backend server and forwarded to the reader based upon an outcome of the comparison between the request tag and the first tag.

8. An apparatus for use in a network having an edge layer and a backend layer, the edge layer including a plurality of edge servers, and the backend layer including a plurality of backend servers, the apparatus comprising:
a memory;
a communications interface; and
at least one processor operatively coupled to the memory and the communications interface, the at least one processor being configured to:
receive a first value-tag pair that corresponds to a content item, the first value-tag pair being received from a writer, the first value-tag pair including a first representation of the content item and a first tag;
transmit a first reception notification message indicating that the first value-tag pair has been received by the at least one processor, the first reception notification message being transmitted to the plurality of edge servers;
receive a plurality of second reception notification messages, each second reception notification message being transmitted by a different one of the plurality of the edge servers and indicating that the edge server has also received the first value-tag pair from the writer;
generate a first coded data item based on the first value-tag pair by using regeneration coding, the first coded data item encoding only a portion of the first representation of the content item; and
transmit, by the communications interface, the first coded data item to a given one of the plurality of backend servers,
wherein the first coded data item is generated and transmitted to the given backend server only when a predetermined count of second reception notification messages is received by the at least one processor.

9. The apparatus of claim 8, wherein the at least one processor is further configured to:
store the first value-tag pair in the memory, the first value-tag pair being stored in the memory after the predetermined count of second reception notification messages is received and before the first coded data item is generated; and
transmit an acknowledgement to the writer indicating that the at least one processor has received the value tag pair, the acknowledgement being transmitted after the predetermined count of second reception notification messages is received and before the first coded data item is generated.

10. The apparatus of claim 8, wherein the at least one processor is configured to wait until the predetermined count of second reception notification messages is received by the at least one processor before generating and transmitting the first coded data item.

11. The apparatus of claim 8, further comprising receiving a second value-tag pair that corresponds to the content item, wherein:
the second value-tag pair includes a second representation of the content item and a second tag,
the first representation of the content item and the second representation of the content item are different versions of the content item, and
the first coded data item is generated and transmitted only when the first representation is a more recent version of the content item than the second representation.

12. The apparatus of claim 8, wherein:
the at least one processor is further configured to:
receive a second value-tag pair that corresponds to the content item, the second value-tag pair-including a second representation of the content item and a second tag, the first tag including a first value-tag pair identifier and a first writer identifier, and the second tag including a second value-tag pair identifier and a second writer identifier,
detect whether the first tag is greater than the second tag by: comparing the first value-tag pair identifier to the second value-tag pair identifier, and comparing the first writer identifier to the second writer identifier, and
when the second tag is greater than the second tag:
generate a second coded data item based on the second value-tag pair by using regeneration coding and transmit the second coded data item to the given backend server,
the second coded data item encoding only a portion of the second representation of the content item, and
the first coded data item is generated and transmitted when the first tag is greater than the second tag.

13. The apparatus of claim 8, wherein the first reception notification message is transmitted using a primitive broadcast protocol that guarantees that if the first reception notification message is received by one of the plurality of edge servers, the first reception notification message will also be received by all remaining non-faulty ones of the plurality of edge servers.

14. The apparatus of claim 8, wherein the at least one processor is further configured to:
receive a read request for the content item that includes a request tag, the read request being received from a reader;
compare the request tag to the first tag; and
retrieve the first coded data item from the given backend server and transmitting the first coded data item to the reader,
wherein the first coded data item is retrieved from the given backend server and forwarded to the reader based upon an outcome of the comparison between the request tag and the first tag.

15. A non-transitory computer-readable medium storing one or more processor-executable instructions, which when executed by at least one processor cause the at least one processor to perform a method for use in a network having an edge layer and a backend layer, the edge layer including a plurality of edge servers, and the backend layer including a plurality of backend servers, the method comprising:
receiving a first value tag pair that corresponds to a content item, the first value-tag pair being received from a writer, the first value-tag pair including a first representation of the content item and a first tag;
transmitting a first reception notification message indicating that the first value-tag pair has been received by the at least one processor, the first reception notification message being transmitted to the plurality of edge servers;
receiving a plurality of second reception notification messages, each second reception notification message being transmitted by a different one of the plurality of edge servers and indicating that the edge server has also received the first value-tag pair from the writer;
generating a first coded data item based on the first value-tag pair by using regeneration coding, the first coded data item encoding only a portion of the first representation of the content item; and
transmitting the first coded data item to a given one of the plurality of backend servers,
wherein the first coded data item is generated and transmitted to the given backend server only when a predetermined count of second reception notification messages is received at the at least one processor.

16. The non-transitory computer-readable medium of claim 15, wherein the method further comprises:
storing the first value-tag pair in a local storage, the first value-tag pair being stored in the local storage after the predetermined count of second reception notification messages is received and before the first coded data item is generated; and
transmitting an acknowledgement to the writer indicating that the at least one processor has received the value tag pair, the acknowledgement being transmitted after the predetermined count of second reception notification messages is received and before the first coded data item is generated.

17. The non-transitory computer-readable medium of claim 15, wherein the method further comprises waiting until the predetermined count of second reception notification messages is received before generating and transmitting the first coded data item.

18. The non-transitory computer-readable medium of claim 15, wherein:
the method further comprises receiving a second value-tag pair that corresponds to the content item,
the second value-tag pair includes a second representation of the content item and a second tag,
the first representation of the content item and the second representation of the content item are different versions of the content item, and
the first coded data item is generated and transmitted only when the first representation is a more recent version of the content item than the second representation.

19. The non-transitory computer-readable medium of claim 15, wherein:
the method further comprises:
receiving a second value-tag pair that corresponds to the content item, the second value-tag pair-including a second representation of the content item and a second tag, the first tag including a first value-tag pair identifier and a first writer identifier, and the second tag including a second value-tag pair identifier and a second writer identifier,
detecting whether the first tag is greater than the second tag by: comparing the first value-tag pair identifier to the second value-tag pair identifier, and comparing the first writer identifier to the second writer identifier, and
when the second tag is greater than the second tag:
generating a second coded data item based on the second value-tag pair by using regeneration coding, and transmitting the second coded data item to the given backend server,
the second coded data item encodes only a portion of the second representation of the content item, and
the first coded data item is generated and transmitted when the first tag is greater than the second tag.

20. The non-transitory computer-readable medium of claim 15, wherein the first reception notification message is transmitted using a primitive broadcast protocol that guarantees that if the first reception notification message is received by one of the plurality of edge servers, the first reception notification message will also be received by all remaining non-faulty ones of the plurality of edge servers.

* * * * *